United States Patent
Seo et al.

(10) Patent No.: US 11,181,677 B2
(45) Date of Patent: Nov. 23, 2021

(54) POLARIZING FILM, METHOD FOR PREPARING THE SAME, AND DISPLAY DEVICE INCLUDING THE SAME

(71) Applicant: Samsung Display Co., Ltd., Yongin-si (KR)

(72) Inventors: Bongsung Seo, Suwon-si (KR); Ohjeong Kwon, Hwaseong-si (KR); Duckjong Suh, Gwangmyeong-si (KR); Ho Lim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 414 days.

(21) Appl. No.: 16/162,386

(22) Filed: Oct. 17, 2018

(65) Prior Publication Data
US 2019/0219754 A1    Jul. 18, 2019

(30) Foreign Application Priority Data

Jan. 16, 2018  (KR) .................. 10-2018-0005439

(51) Int. Cl.
| | | |
|---|---|---|
| G02B 5/30 | (2006.01) | |
| B29D 11/00 | (2006.01) | |
| G02F 1/1337 | (2006.01) | |
| C09K 19/56 | (2006.01) | |
| C09K 19/54 | (2006.01) | |
| H01L 27/32 | (2006.01) | |
| G02F 1/1335 | (2006.01) | |
| H01L 51/52 | (2006.01) | |
| H01L 27/12 | (2006.01) | |
| C09K 19/60 | (2006.01) | |

(52) U.S. Cl.
CPC ...... G02B 5/3091 (2013.01); B29D 11/00644 (2013.01); C09K 19/542 (2013.01); C09K 19/56 (2013.01); C09K 19/60 (2013.01); G02B 5/3016 (2013.01); G02F 1/133528 (2013.01); G02F 1/133711 (2013.01); H01L 27/124 (2013.01); H01L 51/5281 (2013.01); C09K 2019/546 (2013.01); G02F 2202/043 (2013.01); H01L 27/323 (2013.01); H01L 27/3272 (2013.01)

(58) Field of Classification Search
None
See application file for complete search history.

(56) References Cited

U.S. PATENT DOCUMENTS

| | | |
|---|---|---|
| 8,518,299 B2 | 8/2013 | Lub et al. |
| 10,359,672 B2 * | 7/2019 | Kwon ............... G02F 1/133528 |
| 2014/0285760 A1 | 9/2014 | Song et al. |

FOREIGN PATENT DOCUMENTS

| | | |
|---|---|---|
| KR | 10-0955762 | 4/2010 |
| KR | 100955762 B1 * | 4/2010 |
| KR | 10-1066821 | 9/2011 |
| KR | 10-1174747 | 8/2012 |
| KR | 10-2014-0115180 | 9/2014 |

\* cited by examiner

*Primary Examiner* — Derek S. Chapel
(74) *Attorney, Agent, or Firm* — H.C. Park & Associates, PLC

(57) ABSTRACT

A polarizing film, a method of preparing the polarizing film, and a display device including the polarizing film in which the polarizing film includes a self-aligned polymer matrix; liquid crystals aligned and cured in one direction in accordance with an alignment direction of the polymer matrix; and a dichroic dye aligned in the alignment direction of the liquid crystals.

21 Claims, 9 Drawing Sheets

POLARIZING FILM, METHOD FOR PREPARING THE SAME, AND DISPLAY DEVICE INCLUDING THE SAME

CROSS REFERENCE TO RELATED APPLICATION

This application claims priority from and the benefit of Korean Patent Application No. 10-2018-0005439, filed on Jan. 16, 2018, which is hereby incorporated by reference for all purposes as if fully set forth herein.

BACKGROUND

Field

Exemplary embodiments of the invention relate generally to a polarizing film, a method of preparing the polarizing film, and a display device including the polarizing film, and, more specifically, to polarizing file including a self-aligned polymer matrix.

Discussion of the Background

A polarizing film is an optical film that allows wavelengths of natural light in a specific direction to pass through among wavelengths of natural light in various directions. Such a polarizing film is widely used in liquid crystal display ("LCD") devices and organic light emitting diode ("OLED") display devices.

A polyvinyl alcohol ("PVA") polarizing film has been used as a conventional polarizing film. The PVA film may be obtained by a method of dying iodine or a dichroic dye to a polymer and then stretching the polymer in a certain direction to align the iodine or the dichroic dye. However, the PVA polarizing film is relatively disadvantageous in terms of mass productivity, because the production time is long and the manufacturing cost is high due to the stretching process and the dyeing process, even when the polarizing film is produced by the in-line method. In addition, because the PVA polarizing film is laminated on one side with a triacetylcellulose ("TAC") film, in order to substantially prevent water penetration and significantly reduce degradation in optical performance, the thickness of the film becomes larger, and limits achieving a light weight and thin display device.

In order to address such an issue, various studies have been conducted on a method of preparing a polarizing film through coating by omitting stretching and dyeing processes.

An example of such a method may include forming an alignment film on a glass substrate, coating a mixture of liquid crystals and a dichroic dye on the alignment film, and curing the coated mixture with ultraviolet light to form a film. In such a case, the alignment layer is formed by a rubbing method, a nanopatterning method, a photoalignment method, or the like. Since the coating method using such an alignment film requires a separate alignment film forming step, it is difficult to shorten the manufacturing time. Particularly, in the rubbing method, it is difficult to control the rubbing angle and intensity during rubbing, and defects are caused by fine fibers generated in the rubbing cloth, and thus the production yield is lowered. In addition, since the film includes an alignment film, there is a limit in controlling the thickness of the film to be small.

The above information disclosed in this Background section is only for understanding of the background of the inventive concepts, and, therefore, it may contain information that does not constitute prior art.

SUMMARY

Applicant discovered that using a self-aligned polymer matrix instead of PVA in a polarizing film provides unexpected advantages, particularly when used in a display device. For example, exemplary embodiments of the invention produce a polarizing film having a small thickness and excellent order parameter, dichroic ratio, polarization degree, and transmittance.

A display device having a polarizing film constructed according to the principles and exemplary embodiments of the invention may be light weight, thin, and may exhibit improved visibility. According to one or more particularly advantageous embodiments, a display device having a polarizing film constructed according to the principles and exemplary embodiments of the invention obviates the need for a separate alignment film. As such, since the polarizing film may be manufactured through a coating method without using a separate alignment film, embodiments of the invention may reduce manufacturing costs, shorten the processing time, and improve productivity. In addition, use of a separate alignment film may be obviated, thereby reducing the thickness of the polarizing film.

Additional features of the inventive concepts will be set forth in the description which follows, and in part will be apparent from the description, or may be learned by practice of the inventive concepts.

According to one or more embodiments of the invention, a polarizing film, for a display device, includes a self-aligned polymer matrix, liquid crystals aligned and cured in one direction in accordance with an alignment direction of the polymer matrix, and a dichroic dye aligned in the alignment direction of the liquid crystals.

The alignment direction of the polymer matrix is a horizontal direction.

The self-aligned polymer matriz may be derived from a self-aligned liquid crystal compound including at least one functional group capable of forming hydrogen bonds at a terminal, a side chain or both the terminal and the side chain, and at least one photoreactive functional group at a main chain.

The functional group capable of forming hydrogen bonds may be selected from the group consisting of a hydroxyl group (—OH), an amine group (—NH$_2$), a carboxyl group (—COOH), a sulfonic acid group (—SO$_3$H), and a (meth)acrylate group.

The photoreactive functional group may be selected from the group consisting of —N=N—, —CH=CH—, —C(=O)—CH=CH—, —CH=N—, and —N=N—NH—.

The self-aligned liquid crystal compound may be a compound represented by the following Formula 1:

[Formula 1]

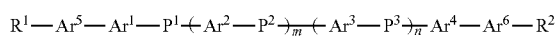

in the Formula 1, m and n may be each independently 0 or 1,

P$^1$, P$^2$, and P$^3$ are photoreactive functional groups that may be each independently selected from the group consisting of: —N=N—, —CH=CH—, —C(=O)—CH=CH—, —CH=N—, and —N=N—NH—, $R^1$ and $R^2$ may be each independently selected from the group consisting of: a hydrogen atom, a deuterium atom, a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH), $Ar^1$, $Ar^2$, $Ar^3$ and $Ar^4$ may be each independently an arylene group having 6 to 30 carbon atoms, $Ar^5$ and $Ar^6$ may be each independently selected from the group consisting of: a single bond, an arylene group having 6 to 30 carbon atoms, a heteroarylene group having 5 to 30 nuclear atoms, and an alkylene group having 1 to 20 carbon atoms,

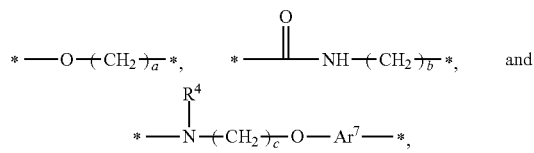

a, b, and c each independently may be an integer of 0 to 10, $R^4$ may be a hydrogen atom or an alkyl group having 1 to 20 carbon atoms, and $Ar^7$ may be selected from the group consisting of: an arylene group having 6 to 30 carbon atoms and a heteroarylene group having 5 to 30 nuclear atoms, wherein the arylene group of $Ar^1$, $Ar^2$, $Ar^3$, and $Ar^4$, the arylene group, the heteroarylene group, and the alkylene group of $Ar^5$ and $Ar^6$, and the arylene group and the heteroarylene group of $Ar^7$ may be optionally each independently substituted with one or more $R^3$s selected from the group consisting of: a deuterium atom (D), a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH), the one or more $R^3$s may be the same as or different from each other, and wherein at least one of $R^1$, $R^2$, and $R^3$ may be selected from the group consisting of: a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH).

The compound represented by Formula 1 may be a compound represented by one of the following Formulas 2 to 6:

[Formula 2]

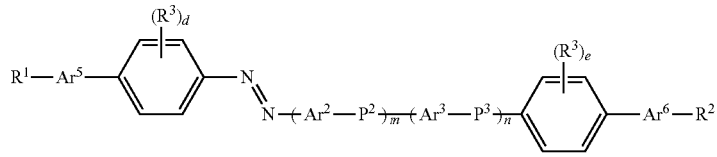

[Formula 3]

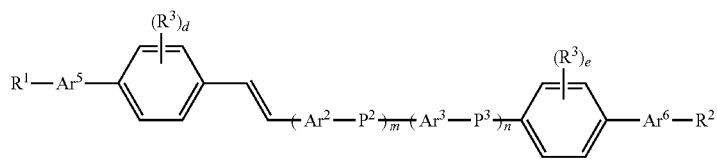

[Formula 4]

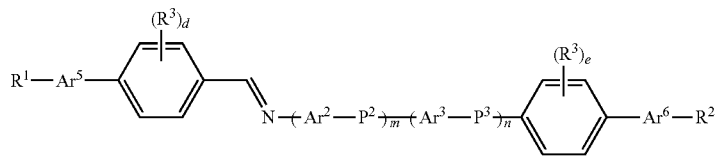

[Formula 5]

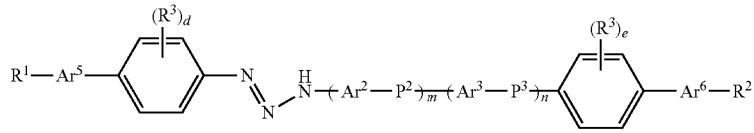

[Formula 6]

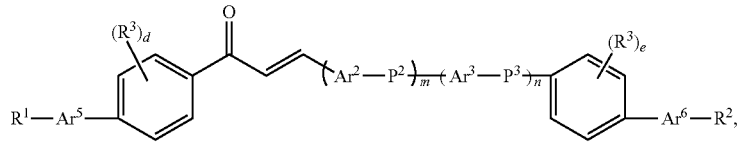

in Formulas 2 to 6, each of m, n, $R^1$, $R^2$, $R^3$, $Ar^2$, $Ar^3$, $Ar^5$ and $Ar^6$ may be as defined as described above in Formula 1, and each of d and e may be an integer of 0 to 4.

A content of the polymer matrix may be in a range from about 3 percent by weight (wt %) to about 30 wt % with respect to the total weight of the corresponding polarizing film.

According to one or more embodiments of the invention, a method of preparing a polarizing film, for a display device, includes the steps of coating, on a base, a composition including a self-aligned liquid crystal compound, a liquid crystal compound and a dichroic dye, irradiating the coated composition with polarized ultraviolet light or visible light, and curing the composition by irradiating, with ultraviolet light, the composition which has been irradiated with polarized ultraviolet light or visible light. The self-aligned liquid crystal compound includes a functional group capable of forming hydrogen bonds at a terminal, a side chain or both the terminal and the side chain, and a photoreactive functional group at a main chain.

The self-aligned liquid crystal compound may a compound represented by the following Formula 1:

[Formula 1]

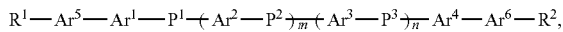

in the formula, m and n may be each independently 0 or 1, $P^1$, $P^2$, and $P^3$ are photoreactive functional groups that may be each independently selected from the group consisting of: —N=N—, —CH=CH—, —C(=O)—CH=CH—, —CH=N—, and —N=N—NH—, $R^1$ and $R^2$ may be each independently selected from the group consisting of: a hydrogen atom, a deuterium atom, a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH), $Ar^1$, $Ar^2$, $Ar^3$ and $Ar^4$ may be each independently an arylene group having 6 to 30 carbon atoms, $Ar^5$ and $Ar^6$ may be each independently selected from the group consisting of: a single bond, an arylene group having 6 to 30 carbon atoms, a heteroarylene group having 5 to 30 nuclear atoms, and an alkylene group having 1 to 20 carbon atoms,

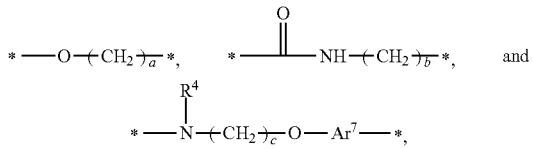

a, b, and c each independently may be an integer of 0 to 10, $R^4$ may be a hydrogen atom or an alkyl group having 1 to 20 carbon atoms, and $Ar^7$ may be selected from the group consisting of: an arylene group having 6 to 30 carbon atoms and a heteroarylene group having 5 to 30 nuclear atoms, wherein the arylene group of $Ar^1$, $Ar^2$, $Ar^3$, and $Ar^4$, the arylene group, the heteroarylene group, and the alkylene group of $Ar^5$ and $Ar^6$, and the arylene group and the heteroarylene group of $Ar^7$ may be optionally each independently substituted with one or more $R^3$s selected from the group consisting of: a deuterium atom, a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH), the one or more $R^3$s may be the same as or different from each other, and wherein at least one of $R^1$, $R^2$, and $R^3$ may be selected from the group consisting of: a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH).

The compound represented by Formula 1 may be a compound represented by one of the following Formulas 2 to 6:

[Formula 2]

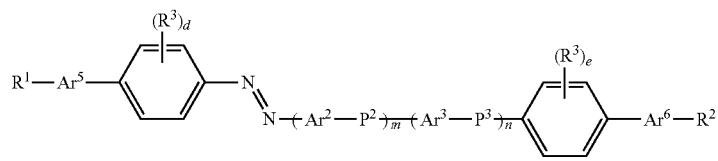

[Formula 3]

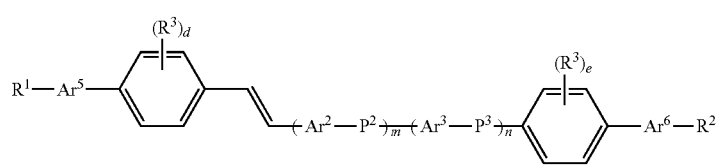

-continued

[Formula 4]

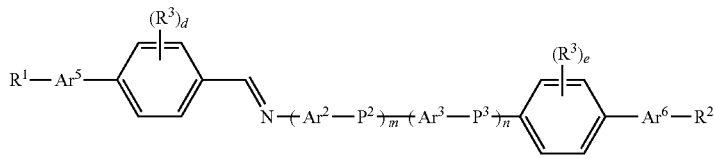

[Formula 5]

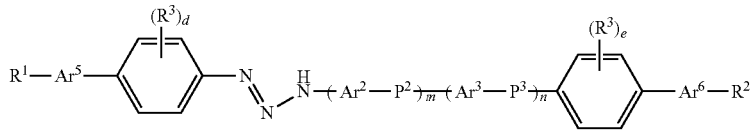

[Formula 6]

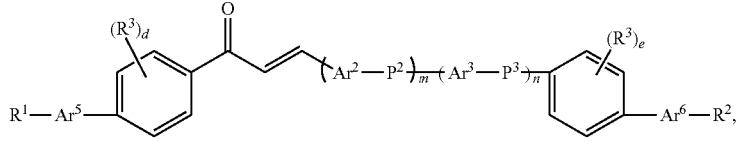

in Formulas 2 to 6, each of m, n, $R^2$, $R^3$, $Ar^2$, $Ar^3$, $Ar^5$ and $Ar^6$ may be as defined above in Formula 1, and each of d and e may be an integer of 0 to 4.

The step of irradiating the coated composition with polarized ultraviolet light or visible light may include irradiating the coated composition with polarized ultraviolet light having a wavelength in a range from about 313 nm to about 365 nm.

The step of irradiating the coated composition with polarized ultraviolet light or visible light may include irradiating the coated composition with polarized ultraviolet light having an energy in a range from about 3 J to about 5 J.

According to one or more embodiments of the invention a display device includes a display panel and a polarizing unit disposed on the display panel. The polarizing unit includes a polarizing film. The polarizing film includes a self-aligned polymer matrix, liquid crystals aligned and cured in one direction in accordance with an alignment direction of the polymer matrix, and a dichroic dye aligned in the alignment direction of the liquid crystals.

The polymer matrix may be derived from a self-aligned liquid crystal compound including at least one functional group capable of forming hydrogen bonds at a terminal, a side chain or both the terminal and the side chain, and at least one photoreactive functional group at a main chain.

The self-aligned liquid crystal compound may a compound represented by the following Formula 1:

[Formula 1]

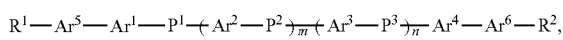

in the formula, m and n may be each independently 0 or 1, $P^1$, $P^2$, and $P^3$ are photoreactive functional groups that may be each independently selected from the group consisting of: —N=N—, —CH=CH—, —C(=O)—CH=CH—, —CH=N—, and —N=N—NH—, $R^1$ and $R^2$ may be each independently selected from the group consisting of: a hydrogen atom, a deuterium atom, a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH), $Ar^1$, $Ar^2$, $Ar^3$ and $Ar^4$ may be each independently an arylene group having 6 to 30 carbon atoms, $Ar^5$ and $Ar^6$ may be each independently selected from the group consisting of: a single bond, an arylene group having 6 to 30 carbon atoms, a heteroarylene group having 5 to 30 nuclear atoms, and an alkylene group having 1 to 20 carbon atoms,

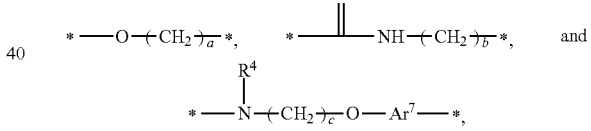

a, b, and c each independently may be an integer of 0 to 10, $R^4$ may be a hydrogen atom or an alkyl group having 1 to 20 carbon atoms, and $Ar^7$ may be selected from the group consisting of: an arylene group having 6 to 30 carbon atoms and a heteroarylene group having 5 to 30 nuclear atoms, wherein the arylene group of $Ar^1$, $Ar^2$, $Ar^3$, and $Ar^4$, the arylene group, the heteroarylene group, and the alkylene group of $Ar^5$ and $Ar^6$, and the arylene group and the heteroarylene group of $Ar^7$ may be optionally each independently substituted with one or more $R^3$s selected from the group consisting of: a deuterium atom, a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH), the one or more $R^3$s may be the same as or different from each other, and wherein at least one of $R^1$, $R^2$, and $R^3$ may be selected from the group consisting of: a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH).

The compound represented by Formula 1 may be a compound represented by one of the following Formulas 2 to 6:

[Formula 2]

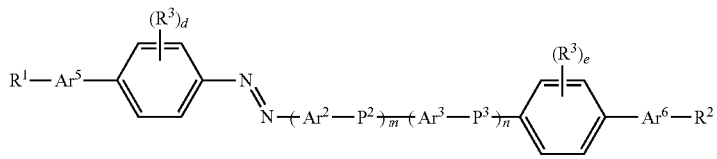

[Formula 3]

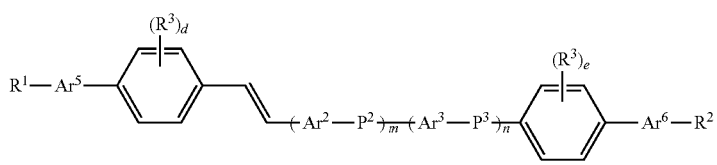

[Formula 4]

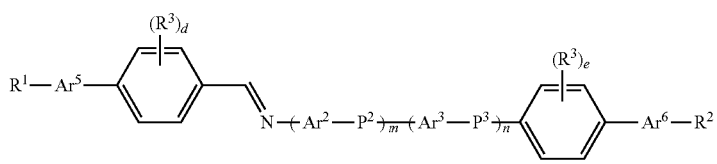

[Formula 5]

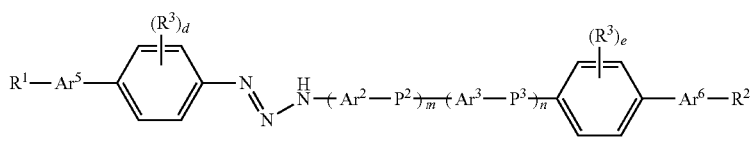

[Formula 6]

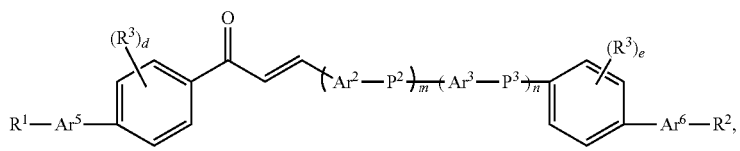

in Formulas 2 to 6, each of m, n, $R^2$, $R^3$, $Ar^2$, $Ar^3$, $Ar^5$ and $Ar^6$ may be as defined above in Formula 1, and each of d and e may be an integer of 0 to 4.

The display panel may further include a first substrate, a second substrate opposing the first substrate, and a light amount control layer between the first substrate and the second substrate. The polarizing unit may include a first polarizing unit disposed on a back surface of the first substrate and a second polarizing unit disposed on a front surface of the second substrate. At least one of the first polarizing unit and the second polarizing unit may include the polarizing film defined above.

The display panel may further include a base substrate, a driving circuit unit disposed on the base substrate, and an organic light emitting element connected to the driving circuit unit.

The display device may further include a touch sensing unit disposed between the display panel and the polarizing unit.

The display device may exclude a separate alignment layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
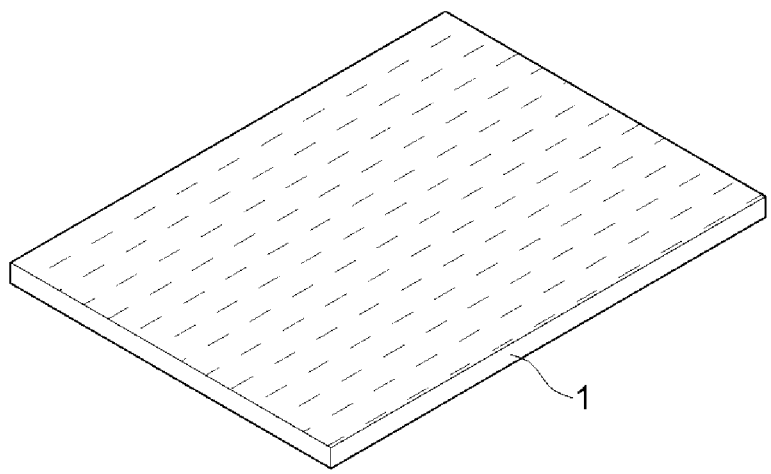
FIG. 1 is a perspective view illustrating a polarizing film constructed according to a first exemplary embodiment of the invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. However, the phrase "A, B, and C are each independently selected from the group consisting of X, Y, and Z" may be construed to mean that A is X only, Y only, or Z only, B is X only, Y only, or Z only, and C is X only, Y only, or Z only. In addition, the phrase "A is selected from the group consisting of X, Y, and Z" may be construed to mean that A is X only, Y only, or Z only.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Exemplary embodiments will now be described more fully hereinafter with reference to the accompanying drawings. Although the invention may be modified in various way and has numerous exemplary embodiments, several exemplary embodiments are illustrated in the accompanying drawings and will be mainly described in the specification. However, the scope of the invention is not limited to the illustrated exemplary embodiments and should be construed as including all the changes, equivalents and substitutions included in the spirit and scope of the claims.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be aligned in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts which are not associated with the description may not be provided in order to specifically describe exemplary embodiments of the invention and like reference numerals refer to like elements throughout the specification.

Hereinafter, a polarizing film according to a first exemplary embodiment of the invention will be described with reference to FIG. 1.

FIG. 1 is a perspective view illustrating a polarizing film constructed according to a first exemplary embodiment of the invention. The polarizing film 1 includes a self-aligned polymer matrix, liquid crystals, and a dichroic dye. The polarizing film 1 has excellent properties in terms of an order parameter, a dichroic ratio, a polarization degree and a transmittance because the liquid crystals and the dichroic dye are aligned (e.g., oriented) in a predetermined direction (preferably, in a horizontal direction) by the polymer matrix. Further, the polarizing film 1 is thin because it does not include an alignment film or a triacetyl-cellulose ("TAC") film. Accordingly, a display device having a polarizing film constructed according to the principles and exemplary embodiments of the invention may be light weight, thin, and may exhibit improved visibility.

The polymer matrix is a polymer component which is self-aligned in one direction, preferably in the horizontal direction, to have directivity and is derived from a liquid crystal compound having self-alignment properties.

The self-aligned liquid crystal compound includes at least one functional group capable of forming hydrogen bonds at a terminal and/or a side chain thereof; and at least one photoreactive functional group at a main chain thereof. Such a self-aligned liquid crystal compound is a monomer which is self-aligned in a specific direction to form a polymer matrix having directivity. In such an exemplary embodiment, since the liquid crystals and the dichroic dye are aligned in a specific direction in accordance with the alignment direction of the polymer matrix, the polarizing film may linearly polarize incident external light. Further, since the liquid crystals, the polymer matrix, and the dichroic dye are uniformly dispersed in the polarizing film according to an exemplary embodiment, the polarizing film may have a uniform polarization degree and a uniform transmittance throughout the film.

In such a self-aligned liquid crystal compound, the functional group capable of forming hydrogen bonds at the terminal and/or the side chain thereof is a part that is hydrogen-bonded to a surface of a base (e.g., glass, an ITO film, etc.). When such a self-aligned liquid crystal compound is coated onto a base, the self-aligned liquid crystal compound is adsorbed on the surface of the base through the hydrogen bond between the base and the functional group capable of forming hydrogen bonds so as to serve as an alignment layer. Accordingly, in one or more particularly advantageous embodiments of the invention, a separate alignment film is obviated, unlike conventional display devices.

The functional group capable of forming hydrogen bonds is not particularly limited as long as it is a functional group including an atom having a strong electronegativity, e.g., nitrogen (N), oxygen (O), fluorine (F), or the like. Examples of such a functional group may include, but are not limited to, a hydroxyl group (—OH), an amine group (—$NH_2$), a carboxyl group (—COOH), a sulfonic acid group (—$SO_3H$), and a (meth)acrylate group, which may be introduced solely or in combination of two or more kinds thereof to the terminal and/or the side chain of the compound. In such an exemplary embodiment, in the case where the functional group capable of forming hydrogen bonds is present at the terminal other than at the side chain, the initial orientation of the liquid crystals may be further improved.

In addition, in the aforementioned self-aligned liquid crystal compound, the photoreactive functional group at the main chain is subjected to trans-cis photoisomerization or photodimerization by polarized ultraviolet irradiation or visible light irradiation, and the structure of the compound may be modified due to the photoisomerization or photodimerization of the photoreactive functional group. For example, a self-aligned liquid crystal compound having a photoreactive functional group of an azo group (—N═N—) undergoes trans-cis photoisomerization by polarized ultraviolet irradiation, and the structure of the compound is changed from a horizontal structure to a substantially bent (L) structure. As such, when the structure of the compound is changed, the alignment direction of the compound changes from a vertical direction to a specific direction, preferably to a horizontal direction.

Non-limiting examples of such photoreactive functional groups may include —N═N—, —CH═CH—, —C(═O)—CH═CH—, —CH═N—, and —N═N—NH—, which may be introduced solely or in combination of two or more kinds thereof to the main chain of the compound.

Specifically, examples of the self-aligned liquid crystal compound may include compounds represented by the following Formula 1, but are not limited thereto.

[Formula 1]

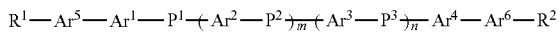

In Formula 1, m and n are each independently 0 or 1, $P^1$, $P^2$, and $P^3$ are photoreactive functional groups that are each independently selected from the group consisting of: —N═N—, —CH═CH—, —C(═O)—CH═CH—, —CH═N—, and —N═N—NH—, $R^1$ and $R^2$ are each independently selected from the group consisting of: a hydrogen atom, a deuterium atom, a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH₂), a carboxyl group (—COOH), a sulfonic acid group (—SO₃H), an alkyl acrylate group having 1 to 20 carbon atoms, and a thiol group (—SH), $Ar^1$, $Ar^2$, $Ar^3$ and $Ar^4$ are each independently an arylene group having 6 to 30 carbon atoms, $Ar^5$ and $Ar^6$ are each independently selected from the group consisting of: a single bond, an arylene group having 6 to 30 carbon atoms, a heteroarylene group having 5 to 30 nuclear atoms, and an alkylene group having 1 to 20 carbon atoms,

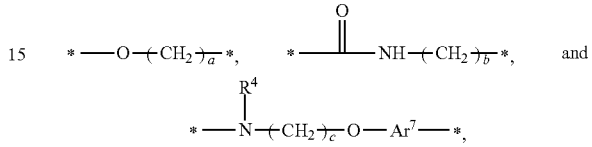

a, b, and c each independently being an integer of 0 to 10, $R^4$ is a hydrogen atom or an alkyl group having 1 to 20 carbon atoms, and $Ar^7$ is selected from the group consisting of an arylene group having 6 to 30 carbon atoms and a heteroarylene group having 5 to 30 nuclear atoms, where the arylene group of $Ar^1$, $Ar^2$, $Ar^3$, and $Ar^4$, the arylene group, the heteroarylene group, and the alkylene group of $Ar^5$ and $Ar^6$, and the arylene group and the heteroarylene group of $Ar^7$ are optionally each independently substituted with one or more $R^3$s selected from the group consisting of: a deuterium atom (D), a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH₂), a carboxyl group (—COOH), a sulfonic acid group (—SO₃H), an alkyl acrylate group having 1 to 20 carbon atoms, and a thiol group (—SH), the one or more $R^3$s being the same as or different from each other, and at least one of $R^1$, $R^2$, and $R^3$ is selected from the group consisting of: a hydroxyl group (—OH), an amine group (—NH₂), a carboxyl group (—COOH), a sulfonic acid group (—SO₃H), an alkyl acrylate group having 1 to 20 carbon atoms, and a thiol group (—SH).

Specific examples of the compound represented by the Formula 1 include compounds represented by the following Formulas 2 to 6, but are not limited thereto.

[Formula 2]

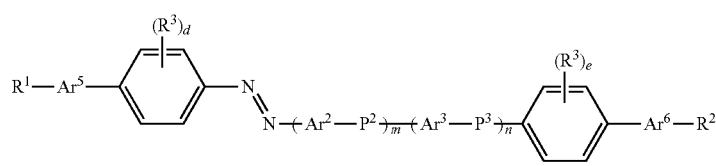

[Formula 3]

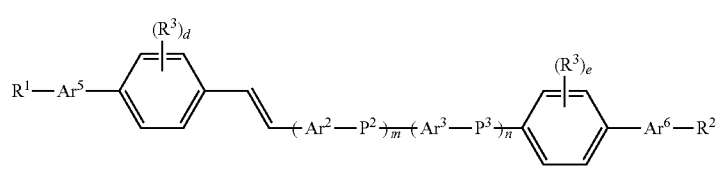

[Formula 4]

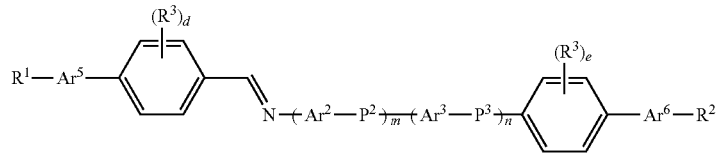

[Formula 5]

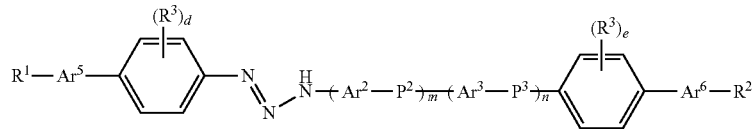

[Formula 6]

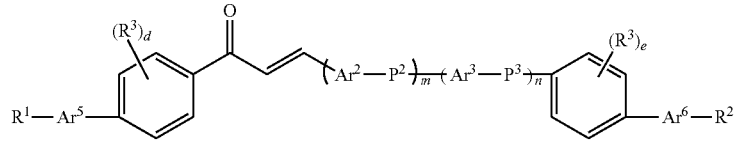

In Formulas 2 to 6, each of m, n, $R^1$, $R^2$, $R^3$, $Ar^2$, $Ar^3$, $Ar^5$ and $Ar^6$ is as defined in Formula 1, and each of d and e is an integer of 0 to 4.

More specific examples of the compound represented by Formula 1 include the following compounds 1 to 10, but are not limited thereto. Among the following compounds, the compounds 1 to 6 may be photoisomerized or photodimerized by visible light to be polymerized into an initial alignment in a direction different from the vertical direction. Further, the compounds 7 to 10 may be photoisomerized or photodimerized by ultraviolet light to be polymerized into an initial alignment in a direction different from the vertical direction.

Compound 1

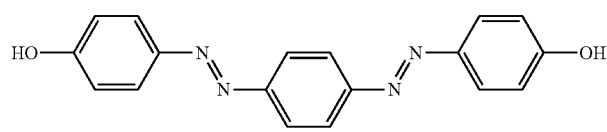

Compound 2

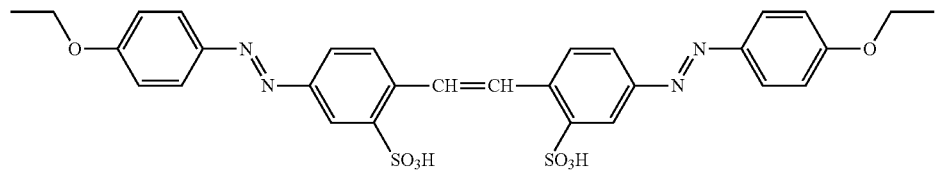

Compound 3

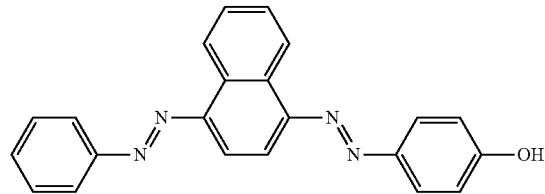

Compound 4

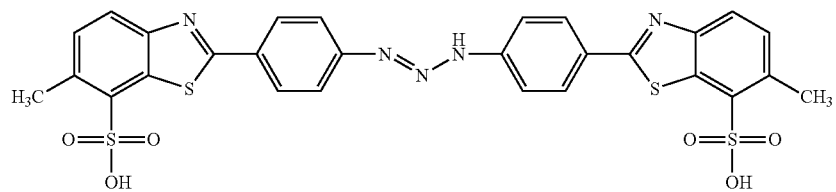

-continued

Compound 5

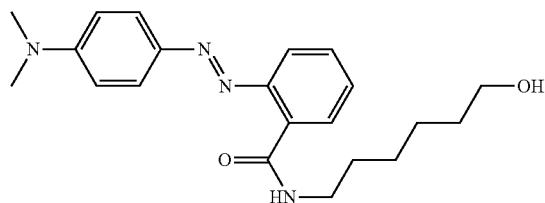

Compound 6

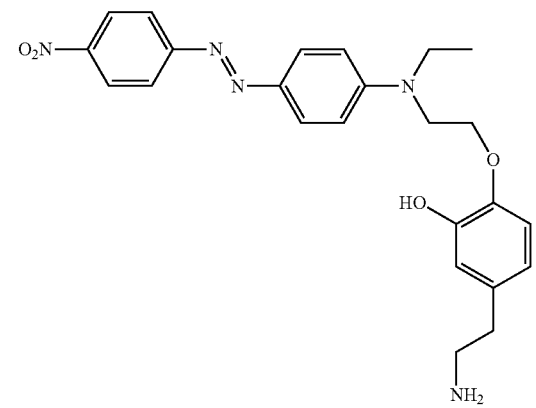

Compound 7

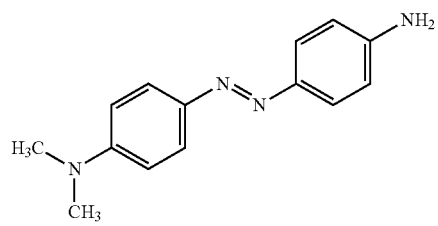

Compound 8

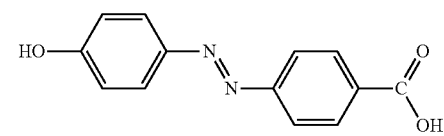

Compound 9

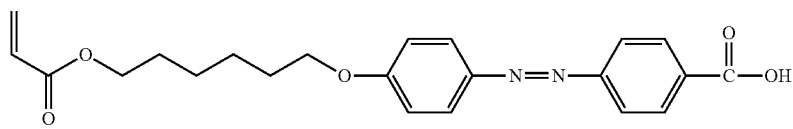

Compound 10

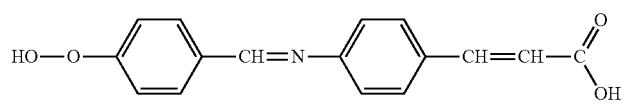

A content of the aforementioned polymer matrix is not particularly limited, and may be, for example, in a range from about 3 percent by weight (wt %) to about 30 wt % with respect to the total weight of the corresponding polarizing film In the polarizing film according to an exemplary embodiment of the invention, the liquid crystals are aligned in one direction, preferably in a length (horizontal) direction of the film, in accordance with the alignment direction of the aforementioned polymer matrix. In such an exemplary embodiment, the liquid crystals are in a cured state and are fixed without changing the alignment direction by external effects such as a voltage or an electric field.

Such liquid crystals are composed of a material derived from a liquid crystal compound including a mesogen functional group which exhibits liquid crystalline behavior and a polymerizable terminal group, and any liquid crystals known in the art may be used without limitation. For example, nematic liquid crystals, smectic A liquid crystals, smectic B liquid crystals, and the like may be used, but exemplary embodiments are not limited thereto.

In the liquid crystal compound, examples of the mesogen functional group may include a bicyclohexyl group, a cyclohexyl-phenyl group, a biphenyl group, a terphenyl group, naphthalene, or the like. Non-limiting examples of the polymerizable terminal group may include (meth)acrylate, ethylene, acetylene, or styrene. However, exemplary embodiments are not limited thereto.

According to an exemplary embodiment of the invention, the content of the liquid crystals may be such that the total amount of the polarizing film is adjusted to be about 100 wt %.

In the polarizing film according to an exemplary embodiment of the invention, the dichroic dye is a component dispersed in the liquid crystals and is aligned in the alignment direction of the liquid crystals. That is, the dichroic dye and the liquid crystals are aligned in a substantially same direction. Since such a dichroic dye has refractive index anisotropy, when aligned in one direction, it may perform a polarization function of transmitting partial components of light and shield the remaining components of the light.

Examples of the dichroic dye are not particularly limited and any dichroic dye known in the art may be used. For example, examples of the dichroic dye may include azo-based dyes, anthraquinone-based dyes, coumarin-based dyes, perylene-based dyes, merocyanine-based dyes, azomethine-based dyes, phthaloperylene-based dyes, indigo-based dyes, dioxadine-based dyes, polythiophene-based dyes, and phenoxazine-based dyes, which may be used solely or in combination of two or more kinds thereof.

The content of the aforementioned dichroic dye is not particularly limited, and may be, for example, in a range from about 3 wt % to about 5 wt % with respect to the total weight of the corresponding polarizing film.

The thickness of the polarizing film according to an exemplary embodiment is not particularly limited, and may be appropriately selected depending on the use of the polarizing film. For example, the thickness of the polarizing film may be in a range from about 2 μm to about 3 μm. In the case where the thickness of the polarizing film is in the above range, the degree of polarization may be in a range from about 99% to about 99.5%, and the transmittance may be in a range from about 35% to about 42%, with respect to an ultraviolet light having a wavelength in a range from about 313 nm to about 365 nm.

A base film may be further disposed on one surface of the polarizing film 1 described above. The base film may be a film that protects a surface of the polarizing film, or a release film, or a substrate of the display device, but exemplary embodiments are not limited thereto. Such a base film may be optically isotropic or anisotropic. However, an alignment film known in the art is not disposed between the polarizing film 1 and the base film.

Examples of the base film may include inorganic films such as glass films, crystalline or amorphous silicon films, quartz, indium tin oxide ("ITO") films or the like; and plastic films such as triacetyl cellulose ("TAC"), cyclo olefin copolymers ("COP") such as norbornene derivatives, poly methyl methacrylate ("PMMA"), polycarbonate ("PC"), polyethylene ("PE"), polypropylene ("PP"), polyvinyl alcohol ("PVA"), diacetyl cellulose ("DAC"), polyacrylate ("PAc"), polyether sulfone ("PES"), polyetheretherketone ("PEEK"), polyphenylsulfone ("PPS"), polyetherimide ("PEI"), polyethylenemaphthatate ("PEN"), polyethyleneterephtalate ("PET"), polyimide ("PI"), polysulfone ("PSF"), polyarylate ("PAR"), or amorphous fluororesin resins.

The polarizing film 1 may be prepared by various methods. However, in preparation of the polarizing film according to embodiments of the invention, a separate alignment film is not formed (or used). In order to prepare the polarizing film 1, after a liquid crystal compound and a dichroic dye are mixed with a self-aligned liquid crystal compound and coated, polarized ultraviolet irradiation or visible light irradiation is performed thereon, and then the resultant mixture is cured. As such, since the polarizing film may be manufactured through a coating method without using a separate alignment film, the invention may reduce manufacturing costs, shorten the processing time, and improve productivity. In addition, if a separate alignment film is not used, the thickness of the polarizing film may be small. In addition, since a polarizing film constructed according to exemplary embodiments of the invention may easily control the initial orientation of the liquid crystals, it may have improved properties in terms of an order parameter, a dichroic ratio, a degree of polarization, and a transmittance may be provided.

According to an exemplary embodiment, a method of manufacturing a polarizing film according to a first exemplary embodiment includes: coating, on a base, a composition including a self-aligned liquid crystal compound, a liquid crystal compound, and a dichroic dye; irradiating the coated composition with polarized ultraviolet light or visible light; and curing the composition by irradiating, with ultraviolet light, the composition irradiated with polarized ultraviolet light or visible light. In such an exemplary embodiment, the self-aligned liquid crystal compound includes a functional group capable of forming hydrogen bonds with the base at a terminal, a side chain, or both the terminal and the side chain, and a photoreactive functional group at a main chain. However, exemplary embodiments are not limited to the above-described manufacturing method, and steps of each process may be modified or selectively mixed if necessary.

Figure 9:
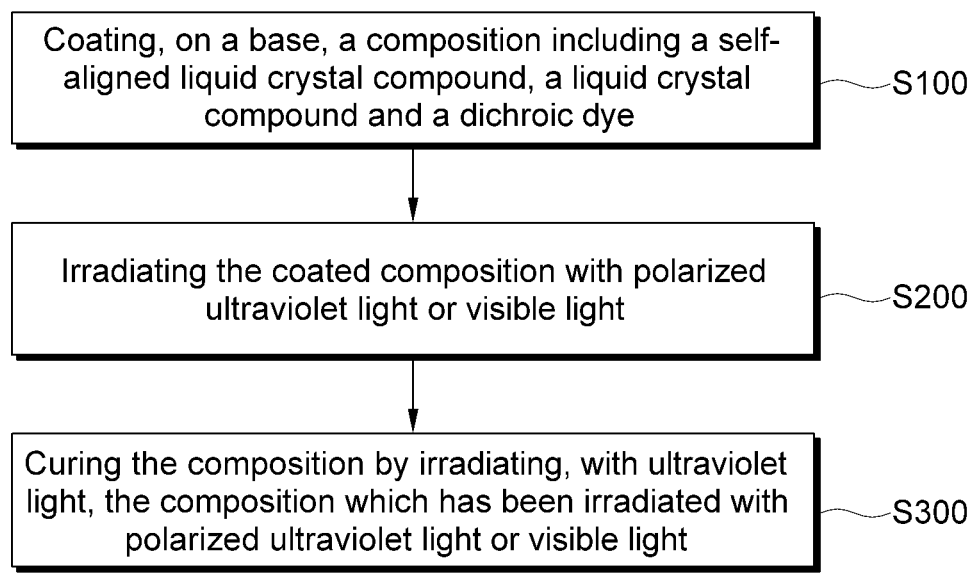
FIG. 9 is a flow chart illustrating a method of preparing a polarizing film constructed according to a sixth exemplary embodiment.

FIG. 9 is a flowchart illustrating a method of preparing a polarizing film constructed according to a sixth exemplary embodiment. Hereinafter, each step of manufacturing the polarizing film according to an exemplary embodiment of the invention will be described below.

(a) First, a composition including a self-aligned liquid crystal compound, a liquid crystal compound and a dichroic dye is coated on a base without a separate alignment film (hereinafter, referred to as "step S100").

In this step, the self-aligned liquid crystal compound is in a state of being uniformly dispersed with the liquid crystal compound and the dichroic dye. When the self-aligned liquid crystal compound is coated on the base together with other components, it is adsorbed onto a surface of a substrate through the hydrogen bonds with the base to be self-aligned in the thickness (vertical) direction of the base.

Specifically, the self-aligned liquid crystal compound includes at least one functional group capable of forming hydrogen bonds at its terminal and/or side chain. When such a self-aligned liquid crystal compound is coated to a substrate, the self-aligned liquid crystal compound is adsorbed, without any special process, to the surface of the base due to the hydrogen bond between the base and the functional group capable of forming hydrogen bonds, and thus becomes self-aligned in the vertical direction of the substrate. In such an exemplary embodiment, the self-aligned liquid crystal compound is self-aligned in the vertical direction in a state of being uniformly dispersed in the liquid crystal compound due to compatibility with the liquid crystal compound.

The method of coating the composition on the base is not particularly limited and may include, for example, roll coating, a printing method, inkjet coating, a slit nozzle method, bar coating, comma coating, spin coating, and gravure coating. However, exemplary embodiments are not limited thereto.

The substrate that may be used in various exemplary embodiments of the invention is not particularly limited, and non-limiting examples of the base may include inorganic films such as glass films, crystalline or amorphous silicon films, quartz, indium tin oxide ("ITO") films or the like; and plastic films such as triacetyl cellulose ("TAC"), cyclo olefin copolymers ("COP") such as norbornene derivatives, poly methyl methacrylate ("PMMA"), polycarbonate ("PC"), polyethylene ("PE"), polypropylene ("PP"), polyvinyl alcohol ("PVA"), diacetyl cellulose ("DAC"), polyacrylate ("PAc"), polyether sulfone ("PES"), polyetheretherketone ("PEEK"), polyphenylsulfone ("PPS"), polyetherimide ("PEI"), polyethylenemaphthatate ("PEN"), polyethyleneterephtalate ("PET"), polyimide ("PI"), polysulfone ("PSF"), polyarylate ("PAR"), or amorphous fluororesin resins. In such exemplary embodiments, the base may be optically isotropic or anisotropic. However, the base may be removed later when the polarizing film is used.

The description of the self-aligned liquid crystal compound, the liquid crystal compound, and the dichroic dye that may be used in the invention is substantially the same as that described in the first exemplary embodiment, and thus will be omitted to avoid redundancy.

The content of the self-aligned liquid crystal compound is not particularly limited, and may be, for example, in a range from about 3 wt % to about 30 wt % with respect to the total weight of the corresponding composition (including the self-aligned liquid crystal compound, the liquid crystal compound and the dichroic dye).

In addition, the content of the dichroic dye is not particularly limited, and may be, for example, in a range from about 3 wt % to about 5 wt % with respect to the total weight of the corresponding composition (including the self-aligned liquid crystal compound, the liquid crystal compound and the dichroic dye).

In addition, the content of the liquid crystal compound is not particularly limited, and may be, for example, such that the total amount of the corresponding composition (including the self-aligned liquid crystal compound, the liquid crystal compound and the dichroic dye) is adjusted to be about 100 wt %.

(b) The coated composition is irradiated with polarized ultraviolet light or visible light (hereinafter, referred to as 'step S200').

In this step, the alignment direction of the self-aligned liquid crystal compound aligned in a direction perpendicular to the surface of the base is changed into another direction, preferably a length (horizontal) direction of the base, according to the optical direction of the polarized ultraviolet light or the visible light, and accordingly, the liquid crystal compound is aligned in one direction. As described above, the initial orientation of the liquid crystal compound may be controlled only by irradiation of polarized ultraviolet light or visible light, without a separate alignment film. Further, the process time may be shortened and productivity may be improved.

Specifically, the self-aligned liquid crystal compound includes at least one photoreactive functional group at its main chain. When the composition including such a self-aligned liquid crystal compound is irradiated with polarized ultraviolet light or visible light, the intramolecular photoreactive functional group undergoes trans-cis photoisomerization or photodimerization, and thus the structure of the compound may be modified and the alignment direction of the self-aligned compound adsorbed on the substrate is changed from the vertical direction to another direction (preferably, in the horizontal direction) in accordance with the polarization direction of the polarized ultraviolet light or the visible light. When the alignment direction of the self-aligned liquid crystal compound is changed, the alignment direction of the liquid crystal compound in the coated composition also changes in accordance with the alignment direction of the self-aligned liquid crystal compound.

In this step, polarized ultraviolet light or visible light is irradiated depending on the kind of the self-aligned liquid crystal compound, and in such a case, the wavelength of the polarized ultraviolet light, the wavelength of the visible light, the exposure energy, and the exposure time may be adjusted. For example, the coated composition may be irradiated with the polarized ultraviolet light having a wavelength in a range from about 313 nm to about 365 nm with a polarized ultraviolet energy in a range from about 3 J to about 5 J to change the alignment direction of the self-aligned liquid crystal compound in the composition into a specific direction.

(c) The composition irradiated with polarized ultraviolet light or visible light in the step S200 is irradiated with ultraviolet light so as to cure the composition (hereinafter, referred to as 'step S300').

This is a step of curing the self-aligned liquid crystal compound, the liquid crystal compound, and the dichroic dye in the composition, which has been irradiated with polarized ultraviolet light or visible light in the step S200, through photopolymerization to form a film. In this step, a polymer matrix self-aligned in a specific direction is formed, and further, liquid crystals aligned in one direction in accordance with the alignment direction of the polymer matrix and a dichroic dye aligned in the alignment direction of the liquid crystals are formed.

Specifically, as described above in the step S200, each component in the composition coated on the substrate is in a state of being aligned in a specific direction due to the irradiation with polarized ultraviolet light or visible light. That is, in the composition subjected to the step S200, the self-aligned liquid crystal compound adsorbed on the substrate is aligned in a specific direction, other than the vertical direction, according to the polarization direction of the polarized ultraviolet light or the visible light, the liquid crystal compound is aligned in one direction according to the alignment direction of the self-aligned liquid crystal compound, and the dichroic dye is uniformly dispersed in the liquid crystal compound. When this composition is irradiated with ultraviolet light, the self-aligned liquid crystal compounds are polymerized with each other in the state of being aligned in a specific direction to form a polymer matrix aligned in a specific direction. In addition, the liquid crystal compounds in the composition are also polymerized by ultraviolet irradiation in a state of being aligned in one direction to form liquid crystals aligned in one direction according to the alignment direction of the polymer matrix. The liquid crystals formed in such a manner, dissimilar to liquid crystals of a liquid crystal layer in a liquid crystal display ("LCD") device, are cured such that the alignment direction of the liquid crystals is not changed by external effects (e.g., voltage, electric field, etc.). The dichroic dye is attached (bonded) to the liquid crystals aligned in one direction, and accordingly, the dichroic dye is also aligned in a direction substantially the same as the alignment direction of the liquid crystals.

According to another exemplary embodiment of the invention, a display device may include embodiments of the aforementioned polarizing film. Unlike conventional polarizing film, the polarizing film according to exemplary embodiments of the invention does not include an alignment film or a TAC film. Thus, the polarizing film may be thin and may linearly polarize external light. Accordingly, the display device according to exemplary embodiments of the invention may be lightweight, thin, and may have improved visibility.

Display devices 101, 102, 103, and 104 illustrated in the figures include a display panel DP and a polarizing unit 100 disposed on the display panel DP. The polarizing unit 100 includes a polarizing film 1 which includes a self-aligned polymer matrix, liquid crystals aligned and cured in one direction in accordance with the alignment direction of the polymer matrix, and a dichroic dye aligned in the alignment direction of the liquid crystals.

Hereinafter, a display device according to a second exemplary embodiment of the invention will be described with reference to FIGS. 2 to 4.

Figure 2:
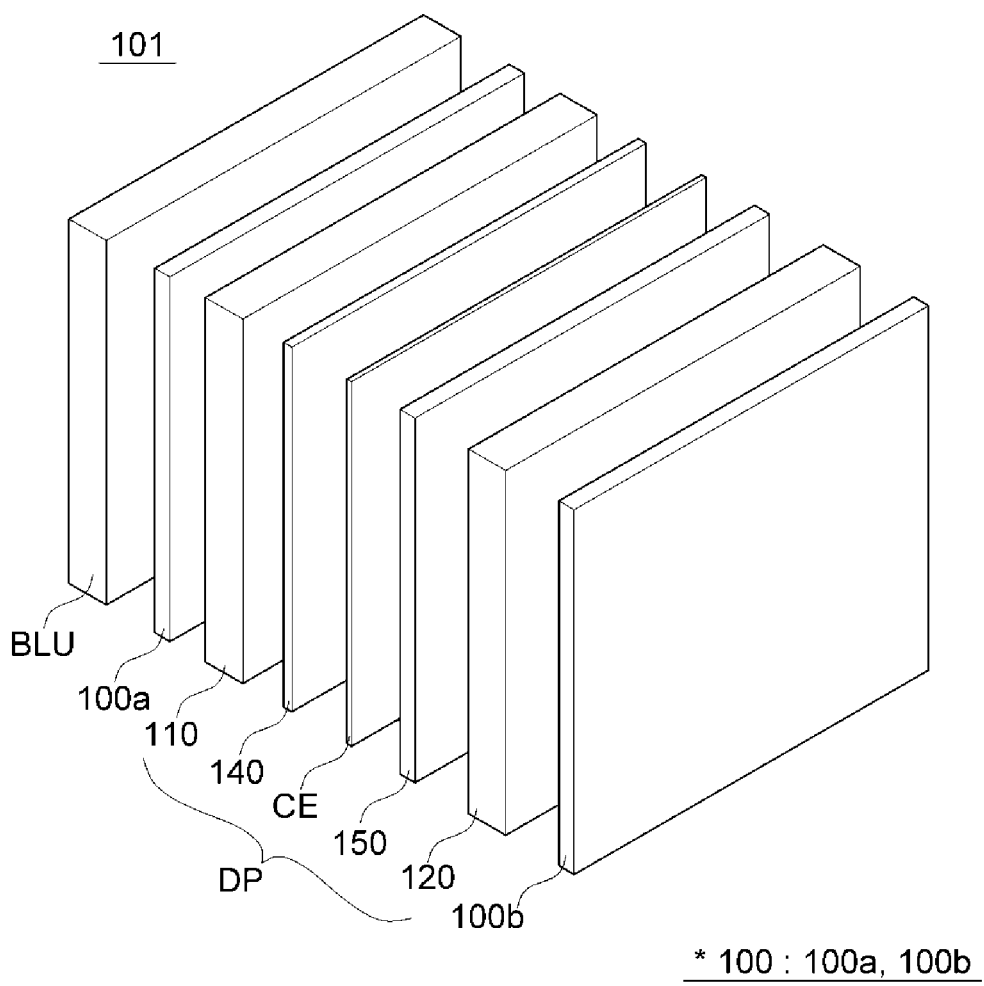
FIG. 2 is an exploded perspective view illustrating a display device constructed according to a second exemplary embodiment of the invention

FIG. 2 is an exploded perspective view illustrating a display device constructed according to a second exemplary embodiment of the invention.

Referring to FIG. 2, the display device 101 according to a second exemplary embodiment includes a display panel DP displaying images, a backlight unit BLU providing light to the display panel DP, and a polarizing unit 100, including first and second polarizing units 100a, 100b, disposed on the display panel DP.

In the display device, the backlight unit BLU may emit ultraviolet light, near ultraviolet light, or the like. The backlight unit BLU may, for example, emit white light or blue light to the display panel DP. Hereinafter, this exemplary embodiment will be described with respect to a display device including a backlight unit BLU that emits blue light.

Figure 3:
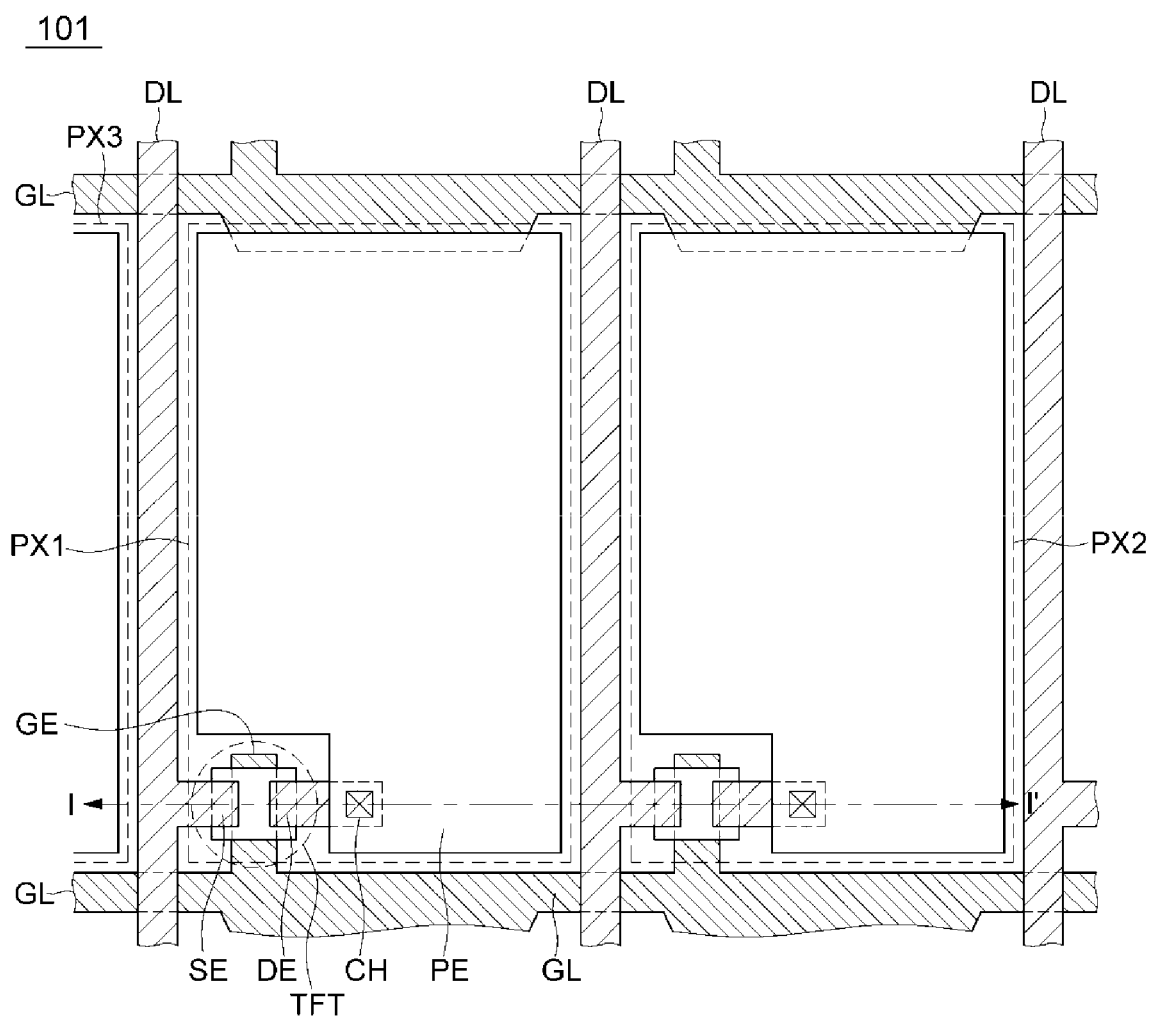
FIG. 3 is a plan view illustrating pixels of the display device illustrated in FIG. 2.
Figure 4:
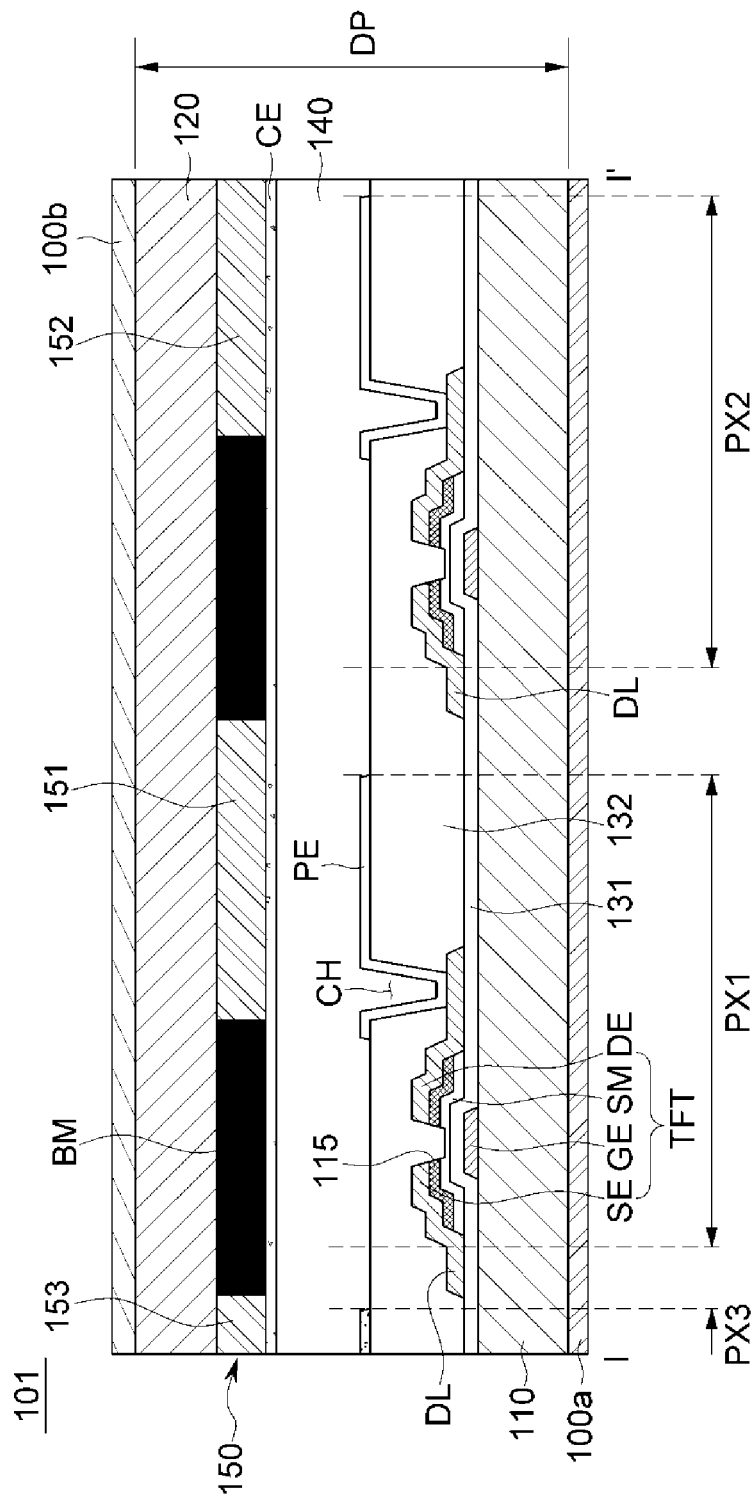
FIG. 4 is a cross-sectional view taken along line I-I' in FIG. 3.

FIG. 3 is a plan view illustrating pixels of the display device illustrated in FIG. 2. FIG. 4 is a cross-sectional view taken along line I-I' in FIG. 3.

The display panel DP is a portion for displaying images. As illustrated in FIGS. 3 and 4, the display panel DP includes a first substrate 110, a second substrate 120 opposing the first substrate 120, and a light amount control layer 140 disposed between the first substrate 110 and the second substrate 120. In addition, the display panel DP includes a common electrode CE disposed between the light amount control layer 140 and the second substrate 120, and a color conversion layer 150 disposed between the common electrode CE and the second substrate 120. In addition, the display panel DP may further include a light blocking layer BM.

The light amount control layer 140 may use any layer that may control transmittance of light provided from the backlight unit BLU. For example, the light amount control layer 140 may be one of a liquid crystal layer, an electro-wetting layer, and an electrophoresis layer. Hereinafter, the light amount control layer 140 will be described on the premise that it is a liquid crystal layer by way of example. In such an exemplary embodiment, the display device 101 may be referred to as an LCD device.

The first substrate 110 includes a transparent material such as glass or plastic. A thin film transistor TFT, a pixel electrode PE, a gate insulating layer 131, and a protective layer 132 are disposed on the first substrate 110. The thin film transistor TFT includes a semiconductor layer SM, an ohmic contact layer 115, a gate electrode GE, a source electrode SE, and a drain electrode DE.

In addition, a plurality of gate lines GL and a plurality of gate electrodes GE are disposed on the first substrate 110. The gate electrode GE and the gate line GL are formed unitarily. The gate line GL and the gate electrode GE may include or be formed of aluminum (Al) or alloys thereof, silver (Ag) or alloys thereof, copper (Cu) or alloys thereof, molybdenum (Mo) or alloys thereof, chromium (Cr), tantalum (Ta) and titanium (Ti). At least one of the gate line GL and the gate electrode GE may have a multilayer structure including at least two conductive layers that have different physical properties from each other.

The gate insulating layer 131 is disposed over the entire surface of the first substrate 110 including the gate line GL and the gate electrode GE. The gate insulating layer 131 may include silicon nitride (SiNx), silicon oxide (SiOx), or the like. In addition, the gate insulating layer 131 may have a multilayer structure including at least two insulating layers having different physical properties.

The semiconductor layer SM is disposed on the gate insulating layer 311. In such an exemplary embodiment, the semiconductor layer SM overlaps the gate electrode GE located below the gate insulating layer 131. The semiconductor layer SM may include or be formed of amorphous silicon, polycrystalline silicon, or the like. In addition, the semiconductor layer SM may include an oxide semiconductor.

The ohmic contact layer 115 is disposed on the semiconductor layer SM. For example, the ohmic contact layer 115 is disposed on the semiconductor layer SM other than a channel portion thereof.

In addition, a plurality of data lines DL are disposed on the gate insulating layer 131. The data lines DL intersect the gate lines GL. The source electrode SE is formed unitarily with the data line DL. The source electrode SE is disposed on the ohmic contact layer 115. The drain electrode DE is disposed on the ohmic contact layer 115 and connected to the pixel electrode PE.

At least one of the data line DL, the source electrode SE, and the drain electrode DE may include or be formed of a refractory metal, such as molybdenum, chromium, tantalum, titanium, and/or an alloy thereof. In addition, at least one of the data line DL, the source electrode SE, and the drain electrode DE may have a multilayer structure including a refractory metal layer and a low resistance conductive layer.

The protective layer 132 is disposed over the entire surface of the first substrate 110 including the semiconductor layer SM, the data line DL, the source electrode SE, and the drain electrode DE. The protective layer 132 may include or be formed of an inorganic insulating material, e.g., silicon nitride ($SiN_x$) or silicon oxide ($SiO_x$). Alternatively, the protective layer 132 may include or be formed of an organic layer. The protective layer 132 may have a double-layer structure including a lower inorganic layer and an upper organic layer.

The pixel electrode PE is disposed on the protective layer 132. In such an exemplary embodiment, the pixel electrode PE is connected to the drain electrode DE through a contact hole CH of the protective layer 132. The pixel electrode PE may include or be formed of a transparent conductive material such as indium tin oxide (ITO) or indium zinc oxide (IZO).

The second substrate 120 opposes the first substrate 110. The second substrate 120 may include or be formed of a transparent material such as glass or plastic.

The common electrode CE is disposed between the light amount control layer 140 and the second substrate 120. The common electrode CE applies an electric field to the light amount control layer 140 together with the pixel electrodes PE. Accordingly, an electric field is formed in the liquid crystal layer, which is the light amount control layer 140, between the common electrode CE and the pixel electrode PE. The common electrode CE may include a transparent conductive material such as ITO or IZO.

The color conversion layer 150 is disposed between the common electrode CE and the second substrate 120, and converts the wavelength of the light incident from the backlight unit BLU to emit light having a different wavelength. The color conversion layer 150 includes a plurality of color converters 151 and 152.

The color converters 151 and 152 include a phosphor (i.e., a fluorescent element) that absorbs light having a predetermined wavelength and emits light having a different wavelength. The color converters 151 and 152 may be separated from each other by the light blocking layer BM. Each of the color converters 151 and 152 is disposed so as to overlap pixels PX1 and PX2. For example, each of the color converters 151 and 152 may be located at an opening of the light blocking layer BM corresponding to the pixel electrode PE. In such an exemplary embodiment, the respective color converters 151 and 152 correspond to the respective pixels PX1 and PX2. For example, the first color converter 151 may correspond to a red pixel PX1, and the second color converter 152 may correspond to a green pixel PX2. That is, the first color converter 151 includes a red phosphor and absorbs the blue light to emit red light, and the second color converter 152 includes a green phosphor and absorbs the blue light to emit green light. Although not illustrated, the color conversion layer 150 may further include a third color converter that absorbs blue light and emits light other than red and green.

The color conversion layer 150 includes a transmissive portion 153. The wavelength of the light passing through the transmitting portion 153 does not change. When the backlight unit BLU emits blue light, the transmissive portion 153 corresponds to a blue pixel PX3.

The light blocking layer BM is disposed on the second substrate 120. The light blocking layer BM has a plurality of openings. The openings are arranged corresponding to each pixel electrode PE of the first and second pixels PX1 and PX2. The light blocking layer BM blocks light in portions other than the openings. For example, the light blocking layer BM is disposed on the thin film transistors TFT, the gate line GL, and the data line DL to block the light that has passed through them from being emitted to the outside. The light blocking layer BM is not invariably necessary, and may be omitted.

In the display device according to FIG. 2, the polarizing unit 100 is disposed on the aforementioned display panel DP, and includes a first polarizing unit 100a and a second polarizing unit 100b.

For example, the first polarizing unit 100a is disposed on a back surface of the first substrate 110, and the second polarizing unit 100b is disposed on a front surface of the second substrate 120. A transmission axis of the first polarizing unit 100a and a transmission axis of the second polarizing unit 100b are substantially orthogonal to each other, and one of them may be arranged in parallel to the gate line GL. However, the second polarizing unit 100b may be embedded in the display panel DP. For example, the second polarizing unit 100b may be disposed between the common electrode CE and the color conversion layer 150. In such an exemplary embodiment, a first passivation layer may be disposed between the common electrode CE and the second polarizing unit 100b, and a second passivation layer may be formed between the color conversion layer 150 and the second substrate 120.

The first polarizing unit 100a and the second polarizing unit 100b may be attached to the first substrate 110 and the second substrate 120, respectively, by an adhesive layer or other means known in the art.

According to an exemplary embodiment, at least one of the first polarizing unit 100a and the second polarizing unit 100b includes the polarizing film 1 described above. Since the description of the polarizing film 1 is substantially the same as that described in the first exemplary embodiment, it will be omitted to avoid redundancy. A protective layer commonly known in the art may be further disposed on one surface or opposite surfaces of the polarizing film 1. For example, when the second polarizing unit 100b includes the polarizing film 1, a protective layer (e.g., a TAC film, a PET film, etc.) may be further disposed on the polarizing film 1.

Hereinafter, an OLED display device according to a third exemplary embodiment will be described with reference to FIGS. 5 and 6.

Figure 5:
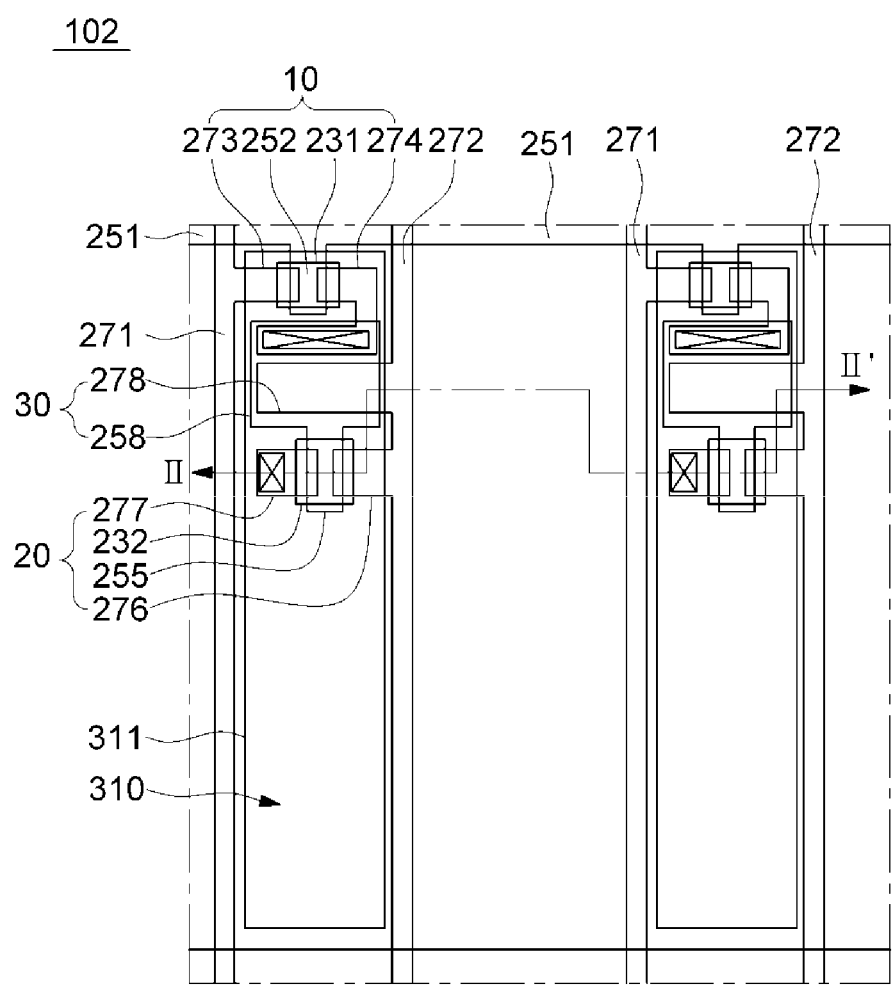
FIG. 5 is a plan view illustrating an organic light emitting diode ("OLED") display device constructed according to a third exemplary embodiment of the invention.

FIG. 5 is a plan view illustrating an organic light emitting diode ("OLED") display device according to a third exemplary embodiment of the invention. FIG. 6 is a cross-sectional view taken along line in FIG. 5.

Specifically, an organic light emitting diode ("OLED") display device 102 according to a third exemplary embodiment includes a display panel DP and a polarizing unit 100 disposed on the display panel DP.

The display panel DP includes a base substrate 211, a driving circuit unit 230, and an OLED 310.

The base substrate 211 may include or be formed of an insulating material such as glass, quartz, ceramics, plastic, and the like. In addition, a polymer film may be used as the base substrate 211.

A buffer layer 220 may be further disposed on the base substrate 211. The buffer layer 220 may include one or more layers selected from various inorganic layers and organic layers. The buffer layer 220 may be omitted.

The driving circuit unit 230 is disposed on the base substrate 211 (or on the buffer layer 220). The driving circuit unit 230 corresponds to a portion including a plurality of thin film transistors ("TFTs") 20 and a capacitor 30, and drives the OLED 310. That is, the OLED 310 emits light according to a driving signal received from the driving circuit unit 230 to display images.

Figure 6:
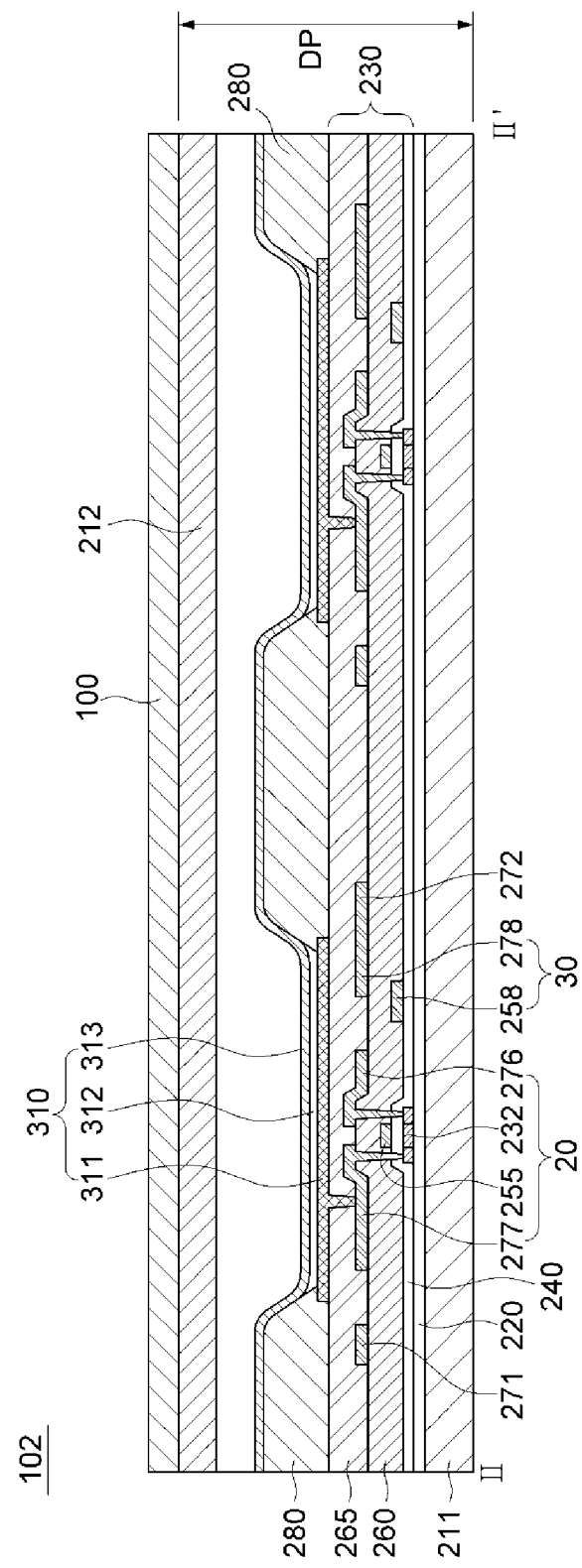
FIG. 6 is a cross-sectional view taken along line II-II' in FIG. 5.

FIGS. 5 and 6 illustrate an active matrix-type organic light emitting diode ("AMOLED") display device 102 having a 2Tr-1Cap structure. For example, the 2Tr-1Cap structure may include two TFTs, e.g., a switching TFT 10 and a driving TFT 20, and one capacitor 30 in each pixel, but exemplary embodiments are not limited thereto. For example, the OLED display device 102 may include three or more TFTs and two or more capacitors in each pixel, and may further include additional wirings. Herein, the term "pixel" refers to a smallest unit for displaying images, and the OLED display device 102 displays images using a plurality of pixels.

One pixel includes the switching TFT 10, the driving TFT 20, the capacitor 30, and the OLED 310. In addition, a gate line 251 extending in one direction, a data line 271 and a common power line 272 insulated from and intersecting the gate line 251 are also disposed in the driving circuit portion 230. One pixel PX may be typically defined by the gate line 251, the data line 271 and the common power line 272, in which they bound the pixel PX, but exemplary embodiments are not limited thereto. The pixel may be defined by a pixel defining layer 280 or a black matrix.

The switching TFT 10 may serve as a switching element which selects a pixel to perform light emission. The switching TFT 10 includes a switching semiconductor layer 231, a switching gate electrode 252, a switching source electrode 273, and a switching drain electrode 274. In such an exemplary embodiment, the switching gate electrode 252 is connected to the gate line 251, the switching source electrode 273 is connected to the data line 271, and the switching drain electrode 274 is spaced apart from the switching source electrode 273 and is connected to one of storage plates of the capacitor 30, e.g., a storage plate 258. The switching semiconductor layer 231 and the switching gate electrode 252 are insulated by a gate insulating layer 240.

The driving TFT 20 applies a driving power to a first electrode 311 which is a pixel electrode. The driving power allows an organic light emitting layer 312 of the OLED 310 in a pixel selected by the switching TFT 10 to emit light. The driving TFT 20 includes a driving semiconductor layer 232, a driving gate electrode 255, a driving source electrode 276, and a driving drain electrode 277. The driving gate electrode 255 is connected to the storage plate 258 that is connected to the switching drain electrode 274. The driving source electrode 276 is connected to the common power line 272, and the common power line 272 is connected to another storage plate of the capacitor 30, e.g., a storage plate 278. The driving drain electrode 277 is connected to the first electrode 311 of the OLED 310 through a contact hole defined in a planarization layer 265. The driving semiconductor layer 232 and the driving gate electrode 255 are insulated by the gate insulating layer 240.

The capacitor 30 includes a pair of storage plates 258 and 278 with an insulating layer 260 interposed therebetween. In such an exemplary embodiment, the insulating layer 260 may be a dielectric element. A capacitance of the capacitor 30 is determined by electric charges accumulated in the capacitor 30 and a voltage across the pair of storage plates 258 and 278.

With the above described structure, the switching TFT 10 is driven by a gate voltage applied to the gate line 251 and serves to transmit a data voltage applied to the data line 271 to the driving TFT 20. In such an exemplary embodiment, a voltage equivalent to a difference between a common voltage applied to the driving TFT 20 from the common power line 272 and the data voltage transmitted from the switching TFT 10 is stored in the capacitor 30, and a current corresponding to the voltage stored in the capacitor 30 flows to the OLED 310 through the driving TFT 20, such that the OLED 310 may emit light.

The OLED 310 is a portion of emitting light according to the driving signal received from the driving circuit 230 to display images. As illustrated in FIG. 6, the OLED 310 includes the first electrode 311, the organic light emitting layer 312, and a second electrode 313, which are sequentially stacked on the substrate 211.

Specifically, the organic light emitting layer 312 is a layer in which excitons are formed by combination of holes and electrons injected from the first electrode 311 and the second electrode 313, respectively. The emission color of the OLED (i.e., an organic electroluminescent element) may be changed according to the material forming the light emitting layer. Such a material forming the organic light emitting layer is not particularly limited as long as it is a substance known in the art to form a light emitting layer. For example, the organic light emitting layer 312 may include a host material such as 4,4'-bis(N-carbazolyl)-1,1'-biphenyl ("CBP"), 4,4'-bis(N-carbazolyl)-1,1'-biphenyl, poly (n-vinylcabazole) ("PVK"), poly(n-vinylcarbazole), 9,10-di (naphthalene-2-yl)anthracene ("ADN"), or 9,10-di (naphthalen-2-yl) anthracene; and a phosphorescent or fluorescent dopant such as an organometallic complex including Ir, Pt, Os, Re, Ti, Zr, and Hf, or a combination of two or more thereof. However, exemplary embodiments are not limited thereto.

Holes and electrons are injected into the organic light emitting layer 312 from the first electrode 311 and the second electrode 313, respectively, and combined therein to form an exciton. Light emission occurs when the exciton falls from an excited state to a ground state.

The first electrode 311 may be a translucent electrode having light transmittance or a reflective electrode having light reflectance. In addition, the second electrode 313 may include a transflective layer or a reflective layer. For example, the first electrode 311 may be a reflective electrode, and the second electrode 313 may be a transflective electrode. Accordingly, the light generated in the organic light emitting layer 312 is emitted through the second electrode 313 to emit light. In such an exemplary embodiment, the OLED display device 102 has a top emission type structure.

One or more metals of magnesium (Mg), silver (Ag), gold (Au), calcium (Ca), lithium (Li), chromium (Cr), aluminum (Al), and copper (Cu), or an alloy thereof may be used to form a transflective electrode and a reflective electrode. In such an exemplary embodiment, whether an electrode is a transflective type or a reflective type depends on the thickness of the electrode. Typically, the transflective electrode has a thickness of about 200 nm or less. As the thickness of the transflective electrode decreases, light transmittance increases. On the other hand, as the thickness of the transflective electrode increases, light transmittance decreases.

For example, the first electrode 311 may include a reflective layer which includes one or more metal of magnesium (Mg), silver (Ag), gold (Au), calcium (Ca), lithium (Li), chromium (Cr), aluminum (Al), or copper (Cu), and a transparent conductive layer on the reflective layer. In such an exemplary embodiment, the transparent conductive layer may include transparent conductive oxide ("TCO"). For example, TCO may include at least one of: indium tin oxide (ITO), indium zinc oxide (IZO), zinc oxide (ZnO), aluminum zinc oxide (AZO) or indium oxide ($In_2O_3$). Since such a transparent conductive layer has a high work function, the first electrode 311 may inject holes into the organic light emitting layer 312 smoothly.

In addition, the first electrode 311 may have a triple-layer structure in which a transparent conductive layer, a reflective layer and a transparent conductive layer are sequentially stacked.

The second pixel electrode 313 may include a transflective layer which includes one or more metal of magnesium (Mg), silver (Ag), gold (Au), calcium (Ca), lithium (Li), chromium (Cr), aluminum (Al), or copper (Cu).

At least one of a hole injection layer HIL and a hole transport layer HTL may further be provided between the first electrode 311 and the organic light emitting layer 312. In addition, at least one of an electron transport layer ETL and an electron injection layer EIL may further be provided between the organic light emitting layer 312 and the second electrode 313. In such an exemplary embodiment, the organic light emitting layer 312, the hole injection layer HIL, the hole transport layer HTL, the electron transport layer ETL, and the electron injection layer EIL may be referred to as organic layers. Each of the hole injection layer HIL, the hole transport layer HTL, the electron transport layer ETL, and the electron injection layer EIL may be formed using a low molecular organic material or a high molecular organic material commonly known in the art.

The pixel defining layer 280 has an opening. The opening of the pixel defining layer 280 exposes a portion of the first electrode 311. The organic light emitting layer 312 and the second electrode 313 are sequentially stacked on the first electrode 311 at the opening of the pixel defining layer 280. In such an exemplary embodiment, the second electrode 313 is formed on the pixel defining layer 280 as well as on the organic light emitting layer 312. In an exemplary embodiment, the hole injection layer HIL, the hole transport layer HTL, the electron transport layer ETL, and the electron injection layer EIL may also be disposed between the pixel defining layer 280 and the second electrode 313. The OLED 310 generates light from the organic light emitting layer 312 located at the opening of the pixel defining layer 280. In such a manner, the pixel defining layer 280 may define a light emission area.

A capping layer may be disposed on the second electrode 313. The capping layer serves to protect the OLED 310 and allow the light generated in the organic layer to be emitted outside efficiently. In particular, the capping layer may substantially prevent light loss due to total reflection of light in the second electrode in the top emission type OLED display device. Any material known in the art to form such a capping layer may be used without particular limitation.

An encapsulation substrate 212 may be further disposed on the second electrode. The encapsulation substrate 212 serves to seal the OLED 310 together with the base substrate 211. The encapsulation substrate 212, similar to the base substrate 211, may include or be formed of an insulating material selected from the group consisting of: glass, quartz, ceramics, and plastic.

A color conversion layer and a light blocking layer may be disposed on the encapsulation substrate 212. The color conversion layer converts the wavelength of light incident from the OLED 310 to emit light having a different wavelength. The description of the color conversion layer and the light blocking layer is substantially the same as that described in the second exemplary embodiment, and thus will be omitted to avoid redundancy.

In the OLED display device 102, the polarizing unit 100 is disposed on the aforementioned display panel DP. The polarizing unit 100 includes the polarizing film 1 described in the first exemplary embodiment. Since the polarizing film 1 does not include an alignment film, unlike conventional display devices, the polarizing film 1 may have a small thickness and allow external light to be linearly polarized. Accordingly, the OLED display device 102, may be slimmer in thickness, and the reflection of external light may be effectively prevented using the polarizing unit 100, thereby improving visibility.

Since the description of the polarizing film 1 is substantially the same as that described in the first exemplary embodiment, it will be omitted to avoid redundancy.

A retardation film (a phase difference film) may be further disposed on one surface of the polarizing film 1. The retardation film may convert linearly polarized light into circularly polarized light, or may convert circularly polarized light into linearly polarized light. For example, external light incident to the polarizing unit 100 is linearly polarized by the polarizing film 1, and circularly polarized by the retardation film (not illustrated). The circularly polarized external light is reflected inside the display device to be reflected light, and the phase and the polarization axis change in the reflection process. Accordingly, the reflected light with a changed phase may not pass through the polarizing unit 100, and thus reflection of external light may be substantially prevented by the polarizing unit 100.

The retardation film may include a quarter retardation film and/or a half retardation film. For example, the quarter retardation film and the half retardation film may be sequentially disposed on the polarizing film 1. Any retardation film known in the art may be used without particular limitation. For example, a polymer film such as polycarbonate, polyvinyl alcohol, polystyrene, polymethyl methacrylate, polypropylene, polyolefin, polyarylate, polyamide or the like may be stretched to form the retardation film.

Figure 7:
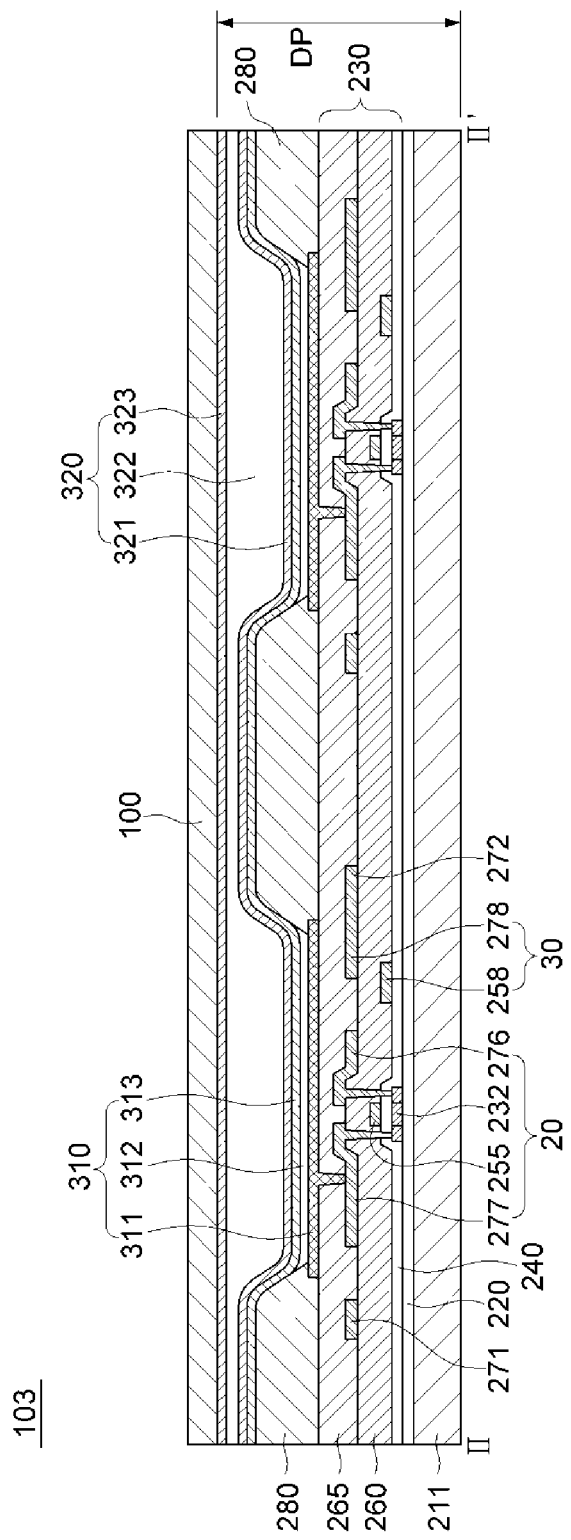
FIG. 7 is a cross-sectional view illustrating an OLED display device constructed according to a fourth exemplary embodiment of the invention.

Hereinafter, an OLED display device according to a fourth exemplary embodiment will be described. FIG. 7 is a cross-sectional view illustrating an OLED display device constructed according to a fourth exemplary embodiment of the invention.

The OLED display device 103 includes a display panel DP and a polarizing unit 100 disposed on the display panel DP.

The display panel DP includes a thin film encapsulation layer 320 disposed on a second electrode. Configurations other than the thin film encapsulation layer are substantially the same as those described in the third exemplary embodiment, and thus a description thereof will be omitted to avoid redundancy.

The thin film encapsulation layer 320 is a layer for protecting an OLED 310. The thin film encapsulation layer 320 includes one or more inorganic layers 321 and 323 and one or more organic layers 322, and substantially prevents outside air such as moisture or oxygen from permeating into the OLED 310.

The thin film encapsulation layer 320 has a structure in which the one or more inorganic layers 321 and 323 and the one or more organic layers 322 are alternately stacked. In FIG. 7, the thin film encapsulation layer 320 includes two inorganic layers 321 and 323 and one organic layer 322, but exemplary embodiments are not limited thereto.

The inorganic layers 321 and 323 may include one or more inorganic materials of: $Al_2O_3$, $TiO_2$, $ZrO$, $SiO_2$, AlON, AlN, SiON, $Si_3N_4$, ZnO and $Ta_2O_5$. The inorganic layers 321 and 323 may be formed through methods such as a chemical vapor deposition (CVD) method or an atomic layer deposition (ALD) method. However, exemplary embodiments are not limited thereto, and the inorganic layers 321 and 323 may be formed using various methods known to those skilled in the art.

The organic layer 322 may include a polymer-based material. Examples of the polymer-based material may include, for example, an acrylic resin, an epoxy resin, polyimide, and polyethylene. In addition, the organic layer 322 may be formed through a thermal deposition process. The thermal deposition process may be performed within a temperature range that may not damage the OLED 310. However, exemplary embodiments are not limited thereto, and the organic layer 322 may be formed using various methods known to those skilled in the pertinent art.

The inorganic layers 321 and 323 which have a high density of thin layer may prevent or efficiently reduce infiltration of, mostly, moisture or oxygen. Permeation of moisture and oxygen into the OLED 310 may be largely prevented by the inorganic layers 321 and 323. Moisture and oxygen that have passed through the inorganic layers 321 and 323 are blocked again by the organic layer 322. The organic layer 322 has a less effect of preventing moisture permeation than the inorganic layers 321 and 323. However, the organic layer 322 may also serve as a buffer layer to reduce stress between respective ones of the inorganic layers 321 and 323, in addition to the moisture-permeation preventing function. In addition, since the organic layer 322 has planarizing characteristics, an uppermost surface of the thin film encapsulation layer 320 may be planarized.

The thin film encapsulation layer 132 may have a thickness of about 10 μm or less. Accordingly, the OLED display device 103 may also have a small thickness. By applying the thin film encapsulation layer 320 as described above, the OLED display device 103 may have flexible characteristics.

In the case where the thin film encapsulation layer 320 is used in place of the encapsulation substrate 212, which is different from the second exemplary embodiment, and a flexible substrate is used as the base substrate 211, the OLED display device 103 may serve as a flexible display device.

The polarizing unit 100 is disposed on the thin film encapsulation layer 320 described above. This polarizing unit 100 includes the polarizing film 1 described in the first exemplary embodiment. Since the configurations of the polarizing unit 100 is substantially the same as those described in the third exemplary embodiment, a detailed description thereof will be omitted to avoid redundancy.

Figure 8:
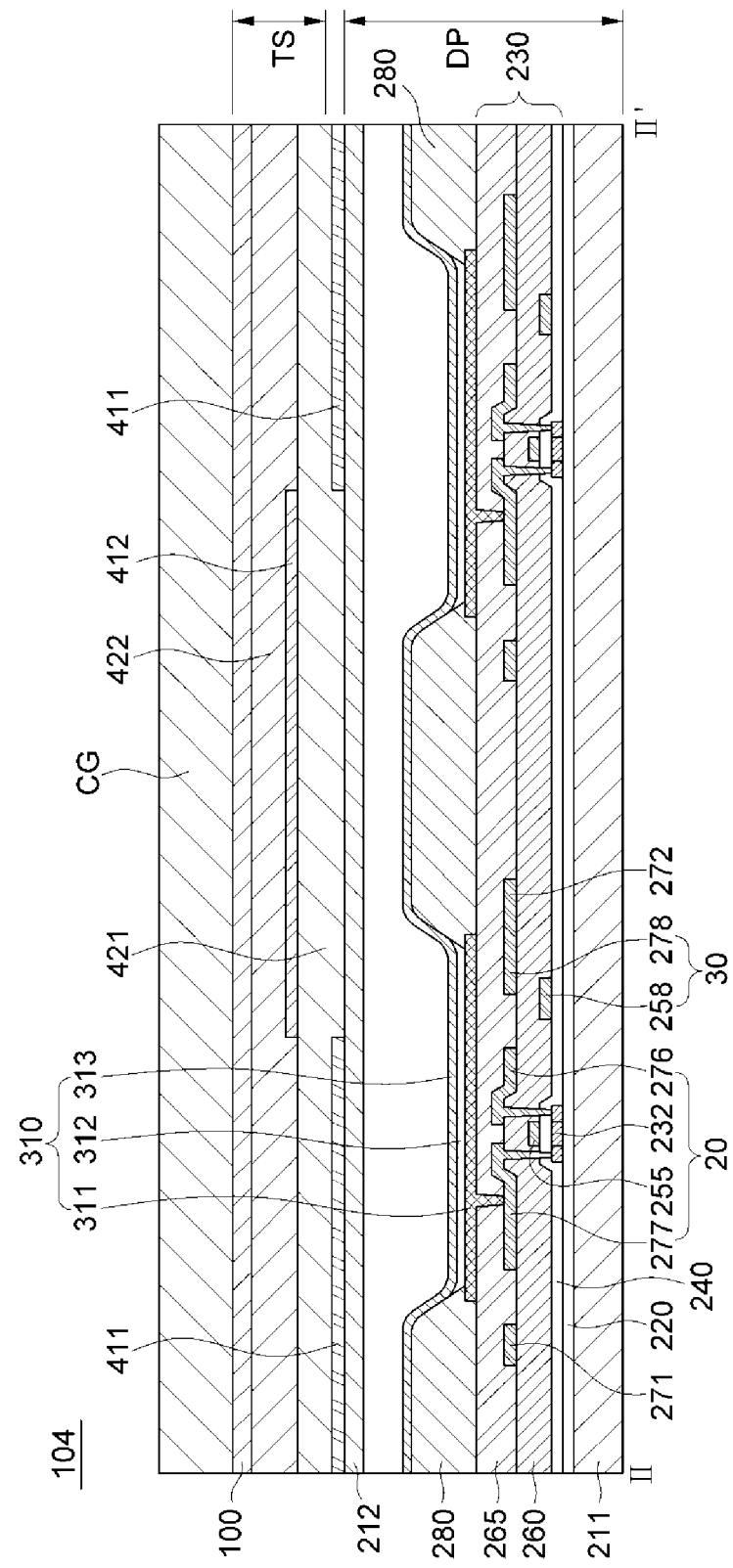
FIG. 8 is a cross-sectional view illustrating an OLED display device constructed according to a fifth exemplary embodiment of the invention.

Hereinafter, an OLED display device 104 according to a fifth exemplary embodiment will be described. FIG. 8 is a cross-sectional view illustrating the OLED display device constructed according to a fifth exemplary embodiment of the invention.

The OLED display device 104 includes a display panel DP, a polarizing unit 100 on the display panel DP, and a touch sensing unit TS between the display panel DP and the polarizing unit 100. In addition, a cover glass CG may be disposed on the polarizing unit 100. However, the touch sensing unit TS may be disposed on the polarizing unit 100.

Since the configurations of the display panel DP and the polarizing unit 100 are substantially the same as those described in the third exemplary embodiment, a detailed description thereof will be omitted to avoid redundancy.

Although it is assumed that the touch sensing unit TS is an on-cell type touch sensing unit that is disposed directly on the display panel DP without a separate substrate, exemplary embodiments are not limited thereto. Alternatively, the touch sensing unit TS may be formed on a separate substrate and then disposed on the display panel DP, or may be formed in an in-cell manner in which the touch sensing unit TS is formed in the display panel DP.

In addition, although the touch sensing unit TS is described on the assumption that a driving electrode and a sensing electrode for detecting a capacitance are disposed on different layers, exemplary embodiments are not limited thereto. The touch sensing unit TS may have a structure in which sensing electrodes for detecting the capacitance are disposed on a same layer and are separated from each other using a bridge electrode.

As illustrated in FIG. 8, the touch sensing unit TS includes a plurality of driving electrodes 411 disposed on the display panel DP, a first insulating layer 421 disposed on the plurality of driving electrodes 411, a plurality of sensing electrodes 412 disposed on the first insulating layer 421, and a second insulating layer 422 disposed on the sensing electrodes 412. However, in an exemplary embodiment, the touch sensing unit TS may only include the plurality of sensing electrodes 412 and the second insulating layer 422.

The shape of the driving electrode 411 and the sensing electrode 412 is not illustrated in the drawings, and is not particularly limited. In an exemplary embodiment, the driving electrode 411 and the sensing electrode 412 may have, for example, rhombus, triangular or quadrangular shapes, or may have a mesh shape.

The driving electrode 411 and the sensing electrode 412 may be appropriately sized to detect a touch input according to the size and purpose of the display device. For example, the area of the driving electrode 411 and the sensing electrode 412 may be in the range of several to several tens of square millimeters (mm$^2$).

The driving electrodes 411 may be disposed in one direction, and the driving electrodes 411 disposed adjacent to each other may be electrically connected to each other by a first connection wiring (not illustrated). The sensing electrode 412 may be disposed in a direction different from a direction in which the driving electrode 411 is disposed. For example, the sensing electrode 412 may be disposed in a direction intersecting the direction in which the driving electrode 411 is disposed. In such an exemplary embodiment, the sensing electrodes 412 disposed adjacent to each other may be electrically connected to each other by a second connection wiring (not illustrated). The first connection wiring and the second connection wiring may be insulated from and intersect each other on a plane. The driving electrode 411 and the sensing electrode 412 may be disposed so as not to overlap each other on a plane.

The driving electrode 411 and the sensing electrode 412 may include a metal or TCO. Examples of TCO may include at least one of: indium tin oxide ("ITO"), indium zinc oxide ("IZO"), zinc oxide ("ZnO"), carbon nanotube ("CNT"), and graphene.

The driving electrode 411 may be connected to a touch driver through a first routing wiring (not illustrated), and the sensing electrode 412 may be connected to the touch driver through a second routing wiring (not illustrated).

The touch driver inputs a driving signal to the driving electrode 411 and may determine the presence of a touch input and touch coordinates by using a capacitance variation or a voltage variation measured by the sensing electrode 412. The touch driver may be disposed directly on the display panel DP in the form of an integrated circuit ("IC") or may be implemented as a separate configuration.

The cover glass CG may be disposed on the polarizing unit 100. For example, the cover glass CG may be disposed on the polarizing unit 100 using an adhesive layer (not illustrated). However, when the polarizing unit 100 includes a polarizing film 1 and a protective film (e.g., a TAC film, a PET film, etc.) disposed on at least one surface of the polarizing film 1, the cover glass CG may be omitted.

The cover glass CG may include any one selected from the group consisting of: glass, sapphire, diamond, polymethyl methacrylate (PMMA) and polycarbonate (PC). The adhesive layer may include a transparent adhesive material. For example, the adhesive layer may be an optical clear resin ("OCR").

As set forth hereinabove, the polarizing film according to one or more exemplary embodiments of the invention has a small thickness, has a high order parameter, and excellent characteristics in terms of dichroic ratio, polarization degree and transmittance. The display device having a polarizing film constructed according to one or more exemplary embodiments of the invention may be lightweight and thin, and may have improved visibility.

In addition, since a method of manufacturing the polarizing film according to one or more exemplary embodiments of the invention does not use a separate alignment film, the manufacturing cost may be reduced, the process time may be shortened, the productivity may be improved, and the initial alignment state of liquid crystals and dichroic dye may be easily controlled.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A polarizing film for a display device, the polarizing film, which does not include an alignment film, comprising:
    a self-aligned polymer matrix;
    liquid crystals aligned and cured in one direction in accordance with an alignment direction of the polymer matrix; and
    a dichroic dye aligned in the alignment direction of the liquid crystals.

2. The polarizing film of claim 1, wherein the alignment direction of the polymer matrix is a horizontal direction.

3. The polarizing film of claim 1, wherein the self-aligned polymer matrix is derived from a self-aligned liquid crystal compound comprising:
    at least one functional group capable of forming hydrogen bonds at a terminal,
    a side chain or both the terminal and the side chain, and at least one photoreactive functional group at a main chain.

4. The polarizing film of claim 3, wherein the functional group capable of forming hydrogen bonds is selected from the group consisting of: a hydroxyl group (—OH), an amine group (—NH$_2$), a carboxyl group (—COOH), a sulfonic acid group (—SO$_3$H), and a (meth)acrylate group.

5. The polarizing film of claim 3, wherein the photoreactive functional group is selected from the group consisting of: —N═N—, —CH═CH—, —C(═O)—CH═CH—, —CH═N—, and —N═N—NH—.

6. The polarizing film of claim 3, wherein the self-aligned liquid crystal compound is a compound represented by the following Formula 1:

[Formula 1]

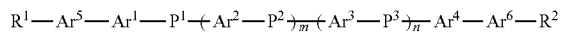

in the Formula 1, m and n are each independently 0 or 1,
P$^1$, P$^2$, and P$^3$ are photoreactive functional groups that are each independently selected from the group consisting of: —N═N—, —CH═CH—, —C(═O)—CH═CH—, —CH═N—, and —N═N—NH—,
R$^1$ and R$^2$ are each independently selected from the group consisting of: a hydrogen atom, a deuterium atom, a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH),
Ar$^1$, Ar$^2$, Ar$^3$ and Ar$^4$ are each independently an arylene group having 6 to 30 carbon atoms,
Ar$^5$ and Ar$^6$ are each independently selected from the group consisting of: a single bond, an arylene group having 6 to 30 carbon atoms, a heteroarylene group having 5 to 30 nuclear atoms, and an alkylene group having 1 to 20 carbon atoms,

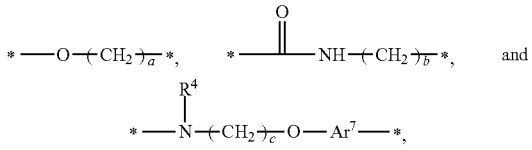

a, b, and c each independently being an integer of 0 to 10,
R$^4$ is a hydrogen atom or an alkyl group having 1 to 20 carbon atoms, and
Ar$^7$ is selected from the group consisting of: an arylene group having 6 to 30 carbon atoms and a heteroarylene group having 5 to 30 nuclear atoms,
wherein the arylene group of Ar$^1$, Ar$^2$, Ar$^3$, and Ar$^4$, the arylene group, the heteroarylene group, and the alkylene group of Ar$^5$ and Ar$^6$, and the arylene group and the heteroarylene group of Ar$^7$ are optionally each independently substituted with one or more R$^3$s selected from the group consisting of: a deuterium atom (D), a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH), the one or more Ras being the same as or different from each other, and
wherein at least one of R$^1$, R$^2$, and R$^3$ is selected from the group consisting of: a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH).

7. The polarizing film of claim 6, wherein the compound represented by Formula 1 is a compound represented by one of the following Formulas 2 to 6:

[Formula 2]

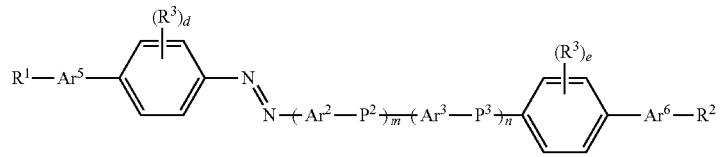

[Formula 3]

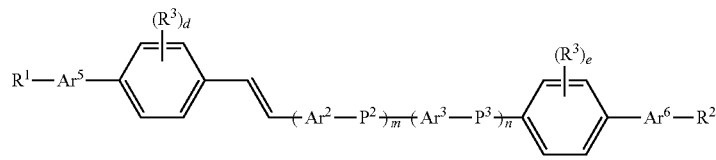

[Formula 4]

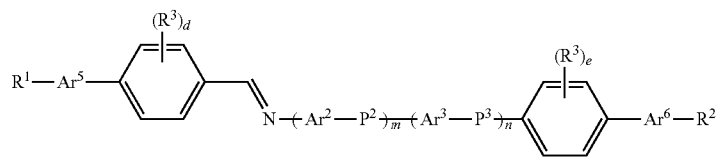

-continued

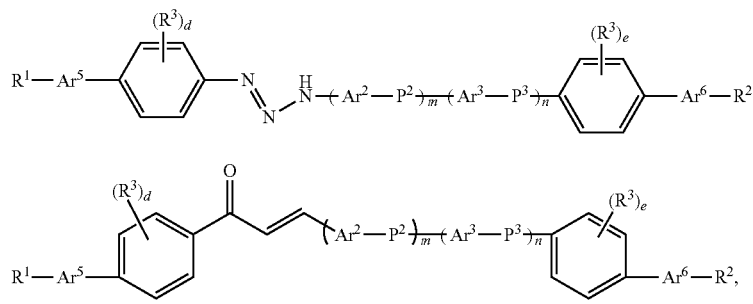

[Formula 5]

[Formula 6]

in Formulas 2 to 6, each of m, n, $R^1$, $R^2$, $R^3$, $Ar^2$, $Ar^3$, $A^5$ and $Ar^6$ is as defined in claim 6, and each of d and e is an integer of 0 to 4.

8. The polarizing film of claim 1, wherein a content of the polymer matrix is in a range from about 3 percent by weight (wt %) to about 30 wt % with respect to the total weight of the corresponding polarizing film.

9. A method of preparing a polarizing film for a display device in which the polarizing film does not include an alignment film, the method comprising the steps of:
coating, on a base, a composition including a self-aligned liquid crystal compound, a liquid crystal compound and a dichroic dye;
irradiating the coated composition with polarized ultraviolet light or visible light; and
curing the composition by irradiating, with ultraviolet light, the composition which has been irradiated with polarized ultraviolet light or visible light,
wherein the self-aligned liquid crystal compound comprises a functional group capable of forming hydrogen bonds at a terminal, a side chain or both the terminal and the side chain, and a photoreactive functional group at a main chain.

10. The method of claim 9, wherein the self-aligned liquid crystal compound is a compound represented by the following Formula 1:

[Formula 1]

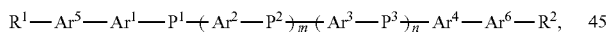

in the formula, m and n are each independently 0 or 1,
$P^1$, $P^2$, and $P^3$ are photoreactive functional groups that are each independently selected from the group consisting of: —N=N—, —CH=CH—, —C(=O)—CH=CH—, —CH=N—, and —N=N—NH—,
$R^1$ and $R^2$ are each independently selected from the group consisting of: a hydrogen atom, a deuterium atom, a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH), $Ar^1$, $Ar^2$, $Ar^3$ and $Ar^4$ are each independently an arylene group having 6 to 30 carbon atoms,
$Ar^5$ and $Ar^6$ are each independently selected from the group consisting of: a single bond, an arylene group having 6 to 30 carbon atoms, a heteroarylene group having 5 to 30 nuclear atoms, and an alkylene group having 1 to 20 carbon atoms,

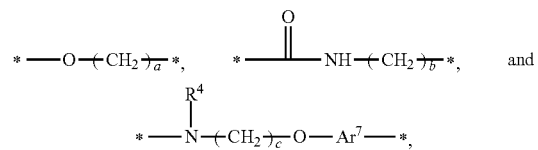

a, b, and c each independently being an integer of 0 to 10,
$R^4$ is a hydrogen atom or an alkyl group having 1 to 20 carbon atoms, and
$Ar^7$ is selected from the group consisting of: an arylene group having 6 to 30 carbon atoms and a heteroarylene group having 5 to 30 nuclear atoms,
wherein the arylene group of $Ar^1$, $Ar^2$, $Ar^3$, and $Ar^4$, the arylene group, the heteroarylene group, and the alkylene group of $Ar^5$ and $Ar^6$, and the arylene group and the heteroarylene group of $Ar^7$ are optionally each independently substituted with one or more $R^3$s selected from the group consisting of: a deuterium atom, a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH), the one or more $R^3$s being the same as or different from each other, and
wherein at least one of $R^1$, $R^2$, and $R^3$ is selected from the group consisting of: a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH).

11. The method of claim 10, wherein the compound represented by Formula 1 is a compound represented by one of the following Formulas 2 to 6:

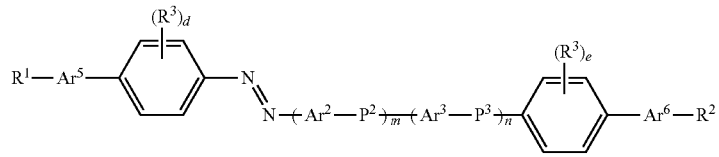

[Formula 2]

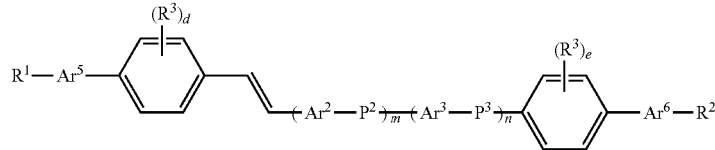

[Formula 3]

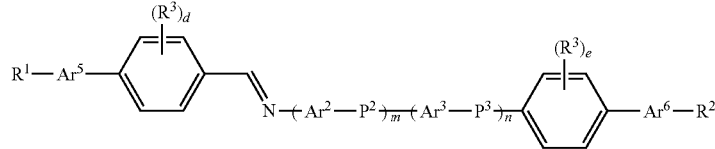

[Formula 4]

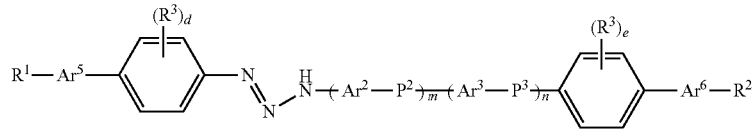

[Formula 5]

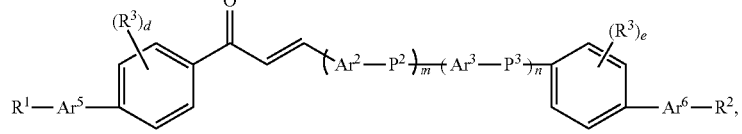

[Formula 6]

in Formulas 2 to 6, each of m, n, $R^1$, $R^2$, $R^3$, $Ar^2$, $Ar^3$, $Ar^5$ and $Ar^6$ is as defined in claim 10, and each of d and e is an integer of 0 to 4.

12. The method of claim 9, wherein the step of irradiating the coated composition with polarized ultraviolet light or visible light comprises irradiating the coated composition with polarized ultraviolet light having a wavelength in a range from about 313 nm to about 365 nm.

13. The method of claim 9, wherein the step of irradiating the coated composition with polarized ultraviolet light or visible light comprises irradiating the coated composition with polarized ultraviolet light having an energy in a range from about 3 J to about 5 J.

14. A display device comprising:
a display panel; and
a polarizing unit disposed on the display panel,
wherein the polarizing unit comprises a polarizing film, which does not include an alignment film, the polarizing film comprising:
a self-aligned polymer matrix;
liquid crystals aligned and cured in one direction in accordance with an alignment direction of the polymer matrix; and
a dichroic dye aligned in the alignment direction of the liquid crystals.

15. The display device of claim 14, wherein the polymer matrix is derived from a self-aligned liquid crystal compound comprising at least one functional group capable of forming hydrogen bonds at a terminal, a side chain or both the terminal and the side chain, and at least one photoreactive functional group at a main chain.

16. The display device of claim 15, wherein the self-aligned liquid crystal compound is a compound represented by the following Formula 1:

[Formula 1]

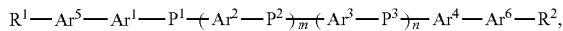

in the formula, m and n are each independently 0 or 1,
$P^1$, $P^2$, and $P^3$ are photoreactive functional groups that are each independently selected from the group consisting of: —N═N—, —CH═CH—, —C(═O)—CH═CH—, —CH═N—, and —N═N—NH—,
$R^1$ and $R^2$ are each independently selected from the group consisting of: a hydrogen atom, a deuterium atom, a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH$_2$), a carboxyl group (—COOH), a sulfonic acid group (—SO$_3$H), an alkyl acrylate group having 1 to 20 carbon atoms, and a thiol group (—SH),
$Ar^1$, $Ar^2$, $Ar^3$ and $Ar^4$ are each independently an arylene group having 6 to 30 carbon atoms,
$Ar^5$ and $Ar^6$ are each independently selected from the group consisting of: a single bond, an arylene group having 6 to 30 carbon atoms, a heteroarylene group having 5 to 30 nuclear atoms, and an alkylene group having 1 to 20 carbon atoms,

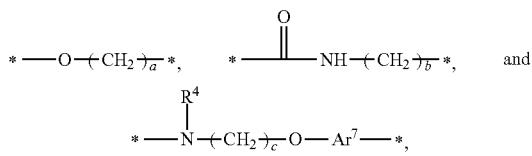

a, b, and c each independently being an integer of 0 to 10,
R⁴ is a hydrogen atom or an alkyl group having 1 to 20 carbon atoms, and Ar⁷ is selected from the group consisting of: an arylene group having 6 to 30 carbon atoms and a heteroarylene group having 5 to 30 nuclear atoms, wherein the arylene group of Ar¹, Ar², Ar³, and Ar⁴, the arylene group, the heteroarylene group, and the alkylene group of Ar⁵ and Ar⁶, and the arylene group and the heteroarylene group of Ar⁷ are each independently substituted with one or more R³s selected from the group consisting of: a deuterium atom, a halogen atom, a cyano group, a nitro group, an alkyl group having 1 to 20 carbon atoms, an aryl group having 6 to 30 carbon atoms, a heteroaryl group having 5 to 30 nuclear atoms, an alkyloxy group having 1 to 20 carbon atoms, an aryloxy group having 6 to 30 carbon atoms, an alkylamine group having 1 to 20 carbon atoms, an arylamine group having 6 to 60 carbon atoms, a hydroxyl group (—OH), an amine group (—NH₂), a carboxyl group (—COOH), a sulfonic acid group (—SO₃H), an alkyl acrylate group having 1 to 20 carbon atoms, and a thiol group (—SH), the one or more R³s being the same as or different from each other, and wherein at least one of R¹, R², and R³ is selected from the group consisting of: a hydroxyl group (—OH), an amine group (—NH₂), a carboxyl group (—COOH), a sulfonic acid group (—SO₃H), an alkyl acrylate group having 1 to 20 carbon atoms, and a thiol group (—SH).

17. The display device of claim 16, wherein the compound represented by Formula 1 is a compound represented by one of the following Formulas 2 to 6:

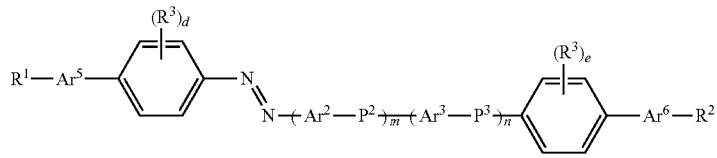

[Formula 2]

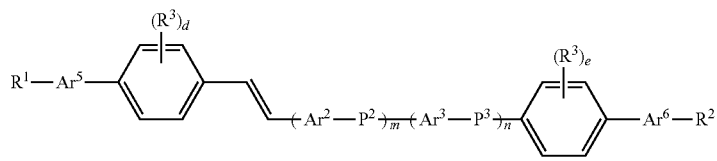

[Formula 3]

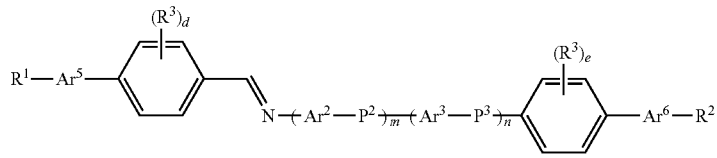

[Formula 4]

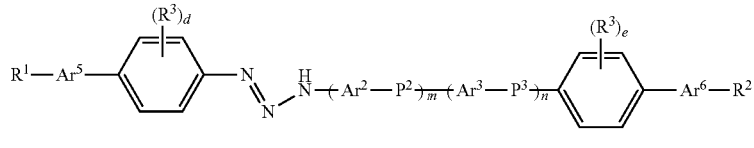

[Formula 5]

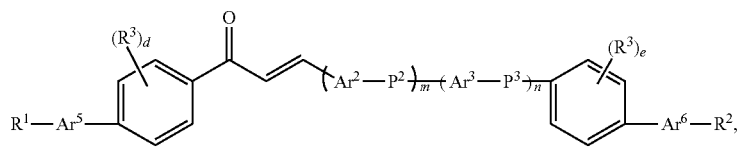

[Formula 6]

in Formulas 2 to 6, each of m, n, R¹, R², R³, Ar², Ar³, Ar⁵ and Ar⁶ is as defined in claim 16, and each of d and e is an integer of 0 to 4.

18. The display device of claim 14, wherein the display panel further comprises:
a first substrate;
a second substrate opposing the first substrate; and
a light amount control layer between the first substrate and the second substrate,
wherein the polarizing unit comprises:
a first polarizing unit disposed on a back surface of the first substrate; and
a second polarizing unit disposed on a front surface of the second substrate, and wherein at least one of the first polarizing unit and the second polarizing unit comprises the polarizing film defined in claim 14.

19. The display device of claim 14, wherein the display panel further comprises:
a base substrate;
a driving circuit unit disposed on the base substrate; and
an organic light emitting element connected to the driving circuit unit.

20. The display device of claim 19, further comprising a touch sensing unit disposed between the display panel and the polarizing unit.

21. The display device of claim 14, wherein the display device excludes a separate alignment layer.

* * * * *